(12) United States Patent  
Tamboli et al.

(10) Patent No.: US 11,961,927 B2  
(45) Date of Patent: Apr. 16, 2024

(54) CASCADE PHOTOCATALYSIS DEVICE

(71) Applicants: Alliance for Sustainable Energy, LLC, Golden, CO (US); The Regents of the University of California, Oakland, CA (US)

(72) Inventors: Adele Clare Tamboli, Golden, CO (US); Joel Wheeler Ager, III, Berkeley, CA (US); Emily Lowell Warren, Golden, CO (US); Calton Junjing Kong, Berkeley, CA (US)

(73) Assignees: Alliance for Sustainable Energy, LLC, Golden, CO (US); The Regents of the University of California, Oakland, CA (US)

( * ) Notice: Subject to any disclaimer, the term of this patent is extended or adjusted under 35 U.S.C. 154(b) by 0 days.

(21) Appl. No.: 17/468,316

(22) Filed: Sep. 7, 2021

(65) Prior Publication Data

US 2022/0077336 A1 Mar. 10, 2022

Related U.S. Application Data

(60) Provisional application No. 63/074,817, filed on Sep. 4, 2020.

(51) Int. Cl.
*H01L 31/043* (2014.01)
*C25B 1/55* (2021.01)
*H01L 31/048* (2014.01)
*H01L 31/0687* (2012.01)
*H01M 4/90* (2006.01)

(52) U.S. Cl.
CPC .............. *H01L 31/043* (2014.12); *C25B 1/55* (2021.01); *H01L 31/048* (2013.01); *H01L 31/0687* (2013.01); *H01M 4/9041* (2013.01)

(58) Field of Classification Search
None
See application file for complete search history.

(56) References Cited

FOREIGN PATENT DOCUMENTS

CN 102719681 A * 10/2012
WO WO-2017105248 A1 * 6/2017 ........... H01L 27/302

OTHER PUBLICATIONS

Machine translation of CN 102719681; published Oct. 10, 2010 (Year: 2010).*
Machine translation of WO 2017/105248; published Jun. 22, 2017 (Year: 2017).*
Tahir, Muhammed; Hierarchical 3D VO2/ZnV2O4 microspheres as an excellent visible light photocatalyst for CO2 reduction to solar fuels; Applied Surface Science, 467-468, 2019, 1170-1180 (Year: 2019).*

(Continued)

*Primary Examiner* — Lindsey A Buck
(74) *Attorney, Agent, or Firm* — Neal Vickery; Sam J. Barkley

(57) ABSTRACT

Described herein are devices and methods utilizing cascade photocatalysis to drive multiple chemical reactions via a series of photoelectrochemical catalysts driven by the conversion of light into current by one or more photovoltaic devices. The described devices and methods are tunable and may be used in conjunction with different reactants and products, including the conversion of carbon dioxide into valuable hydrocarbon products.

14 Claims, 28 Drawing Sheets

(56) References Cited

OTHER PUBLICATIONS

Zhou, Zhenyi et al.; Copper-based materials as highly active electrocatalysts for the oxygen evolution reaction; Materials Today Chemistry 11 (2019) 169-196 (available online Dec. 12, 2018) (Year: 2018).*
Zhu, Wenxin et al.; Nickel sulfide microsphere film on Ni foam as an efficient bifunctional electrocatalyst for overall water splitting; Chem. Commun., 2016, 52, 1486 (Year: 2016).*
Urbain, Felix et al.; A prototype reactor for highly selective solar-driven CO2 reduction to synthesis gas using nanosized earth-abundant catalysts and silicon photovoltaics; Energy Environ. Sci., 2017, 10, 2256 (Year: 2017).*
Chang, Z. et al., "The Tunable and Highly Selective Reduction Products on Ag@Cu Bimetallic Catalysts Toward CO2 Electrochemical Reduction Reaction," Journal of Physical Chemistry C, vol. 121, 2017, 12 pages.
Chen, Y, et al., "Aqueous CO2 Reduction at Very Low Overpotential on Oxide-Derived Au Nanoparticles," Journal of the American Chemical Society, vol. 134, 2012, 4 pages.
Clark, E.L. et al., "Electrochemical CO2 Reduction over Compressively Strained CuAg Surface Alloys with Enhanced Multi-Carbon Oxygenate Selectivity," Journal of the American Chemical Society, vol. 139, 2017, 10 pages.
Dinh, C-T. et al., "CO2 electroreduction to ethylene via hydroxide-mediated copper catalysis at an abrupt interface," Science, vol. 360, 2018, 6 pages.
Essig, S. et al., "Raising the one-sun conversion efficiency of III-V/Si solar cells to 32.8% for two junctions and 35.9% for three junctions," Nature Energy, vol. 2, 2017, 9 pages.
Goodpaster, J.D. et al., "Identification of Possible Pathways for C—C Bond Formation during Electrochemical Reduction of CO2: New Theoretical Insights from an Improved Electrochemical Model," Journal of Physical Chemistry Letters, vol. 7, 2016, 7 pages.
Gurudayal et al., "Si photocathode with Ag-supported dendritic Cu catalyst for CO2 reduction," Energy & Environmental Science, vol. 12, 2019, 10 pages.
Hoffman, Z.B. et al., "Electrochemmical Reduction of Carbon Dioxide to Syngas and Formate at Dendritic Copper-Indium Electrocatalysts," ACS Catalysis, vol. 7, 2017, 10 pages.
Jouny, M. et al., "High-rate electroreduction of carbon monoxide to multi-carbon products," Nature Catalysis, vol. 1, Oct. 2018, 8 pages.
Klein, T.R. et al., "Lamination of transparent conductive adhesives for tandem solar cell applications," Journal of Physics D: Applied Physics, vol. 54, 2021, 7 pages.
Kong, C.J. et al., "Design Principles of Tandem Cascade Photoelectrochemical Devices," Accepted Manuscript, Sustainable Energy Fuels, 2021, DOI: 10.1039/D1SE01322J, 32 pages.
Li, C.W. et al., "Electroreduction of carbon monoxide to liquid fuel on oxide-derived nanocrystalline copper," Nature Letter, vol. 508, Apr. 24, 2014, 17 pages.
Lum, Y. et al., "Sequential catalysis controls selectivity in electrochemical CO2 reduction on CU," Energy & Environmental Science, vol. 11, 2018, 10 pages.
Luo, W. et al., "Selective and Stable Electroreduction of CO2 to CO at the Copper/Indium Interface," ACS Catalysis, vol. 8, 2018, 11 pages.
Lyu, Z. et al., "Controlling the Surface Oxidation of Cu Nanowires Improves Their Catalytic Selectivity and Stability toward C2+ Products in CO2 Reduction," Angewandte Chemie, International Edition, vol. 60, 2021, 7 pages.
Ma, S. et al., "Electroreduction of Carbon Dioxide to Hydrocarbons Using Bimetallic Cu—Pd Catalysts with Different Mixing Patterns," Journal of the American Chemical Society, vol. 139, 2017, 4 pages.
Mistry, H. et al., "Size-dependent reactivity of gold-copper bimetallic nanoparticles during CO2 electroreduction," Elsevier Catalysis Today, vol. 288, 2017, 7 pages.
Morales-Guio, C.G. et al., "Improved CO2 reduction activity towards C2+ alcohols on a tandem gold on copper electrocatalyst," Nature Catalysis, vol. 1, Oct. 2018, 8 pages.
Shinde, N.M. et al., "Sulphur Source-Inspired Self-Grown 3D NixSy Nanostructures and Their Electrochemical Supercapacitors," ACS Applied Materials & Interfaces, vol. 11, 2019, 9 pages.
Sun, K. et al., "Ultrahigh Mass Activity for Carbon Dioxide Reduction Enabled by Gold-Iron Core-Shell Nanoparticles," Journal of the American Chemical Society, vol. 139, 2017, 4 pages.
Theakern, N. et al., "Heterogeneously catalyzed two-step cascade electrochemical reduction of CO2 to ethanol," Elsevier Electrochimica Acta, vol. 274, 2018, 8 pages.
Wang, Y. et al., "CO2 reduction to acetate in mixtures of ultrasmall (Cu)n,(Ag)m bimettalic nanoparticles," PNAS, vol. 115, No. 2, Jan. 9, 2018, 6 pages.
Warren, E.L. et al., "A Taxonomy for Three-Terminal Tandem Solar Cells," ACS Energy Letters, vol. 5, 2020, 10 pages.

* cited by examiner

CASCADE PHOTOCATALYSIS DEVICE

CROSS-REFERENCE TO RELATED APPLICATIONS

This application claims priority from U.S. Provisional Patent Application No. 63/074,817, filed on Sep. 4, 2021, the contents of which are incorporated herein by reference in their entirety.

CONTRACTUAL ORIGIN

This invention was made with government support under Contract No. DE-AC36-08GO28308 awarded by the Department of Energy. The government has certain rights in the invention. This invention was also made with government support under Contract No. DE-AC02-05CH11231 awarded by the U.S. Department of Energy. The government has certain rights in the invention.

BACKGROUND

For solar fuels and more generally, any photocatalytic reaction, selectivity and efficiency limit the complexity of the possible reactions that can be driven. Reduction of $CO_2$ to liquid fuels, in particular, is challenging because of the number of reaction intermediates, possible undesirable reaction pathways, and different potentials and catalysts required for each step. Previous cascade photocatalytic devices have used two different catalysts for an electrically driven, two step $CO_2$ reduction process.

SUMMARY

Described herein are devices and methods utilizing cascade photocatalysis to drive multiple chemical reactions via a series of photoelectrochemical catalysts driven by the conversion of light into current by one or more photovoltaic devices. The described devices and methods are tunable and may be used in conjunction with different reactants and products, including the conversion of carbon dioxide into valuable hydrocarbon products.

In an aspect, provided is a device comprising: a) a photovoltaic device capable of generating current at a plurality of potentials; b) a first catalyst in electronic communication with the photovoltaic device; c) a second catalyst in electronic communication with the photovoltaic device.

In an aspect, provided is a method comprising: a) providing a photovoltaic device which generates current at a plurality of potentials; b) catalyzing a first reaction using a first electrocatalyst by providing current at a first potential; c) catalyzing a second reaction using a second electrocatalyst by providing current at a second potential.

The photovoltaic device may be a multijunction stacked semiconductor device, for example, a three-terminal tandem (3TT) semiconductor device. The photovoltaic device may be a plurality of photovoltaic devices positioned on a substrate. The photovoltaic device may be a doped interdigitated back contact semiconductor device, wherein the first catalyst is in communication with a first doped region and the second catalyst is in communication with a second doped region. The catalysts may be provided as a transparent conductive adhesive layer (TCA) comprising a polymer and a plurality of microspheres of the catalysts as described herein. TCA may also refer to a transparent conductive encapsulant.

The photovoltaic device may comprise one or more semiconductors, for example, InGaP, GaAs, GaN, perovskite and silicon.

The catalysts may comprise silver, gold or copper and may be patterned or positioned in various ways known in the art.

The first catalyst may be configured to catalyze a first reaction when receiving current at a first potential from the photovoltaic device and the second catalyst may be configured to catalyze a second reaction when receiving current at a second potential from the photovoltaic device. For example, the first reaction may be the reduction of carbon dioxide to carbon monoxide or a first hydrocarbon (such as ethylene) and the second reaction is the reduction of carbon monoxide to a second hydrocarbon (again, such as ethylene).

The provided methods and devices may contain a plurality of additional catalysts for catalyzing additional reactions at additional potentials. The devices may include additional components including, for example, reference electrode and potentiostats. The devices may also be configured to drive opposing reactions via an additional catalyst, for example, to generate additional reactants such as hydrogen gas.

In an aspect, provided is a device comprising: a) a three-terminal tandem semiconductor photovoltaic device capable of generating current at a first potential and a second potential; b) a Ag or Au electrocatalyst in electronic communication with the photovoltaic device configured to catalyze a first reaction upon receiving current at the first potential; and c) a Cu electrocatalyst in electronic communication with the photovoltaic device configured to catalyze a second reaction upon receiving current at a second potential.

BRIEF DESCRIPTION OF DRAWINGS

Some embodiments are illustrated in referenced figures of the drawings. It is intended that the embodiments and figures disclosed herein are to be considered illustrative rather than limiting.

FIG. 8A: formaldehyde forming catalyst coupled to the GaAs cell and the methanol forming catalyst coupled to the GaInP cell; FIG. 8B: formaldehyde forming catalyst coupled to the GaInP cell and the methanol forming catalyst coupled to the GaAs cell. Parameters for the simulations are listed in Tables 3 and 4.

FIG. 11A: Behavior of the GaInP cell. FF=0.88. FIG. 11B: Behavior of the GaAs cell as a bottom cell. FF=0.85

REFERENCE NUMERALS

Figure 1A:
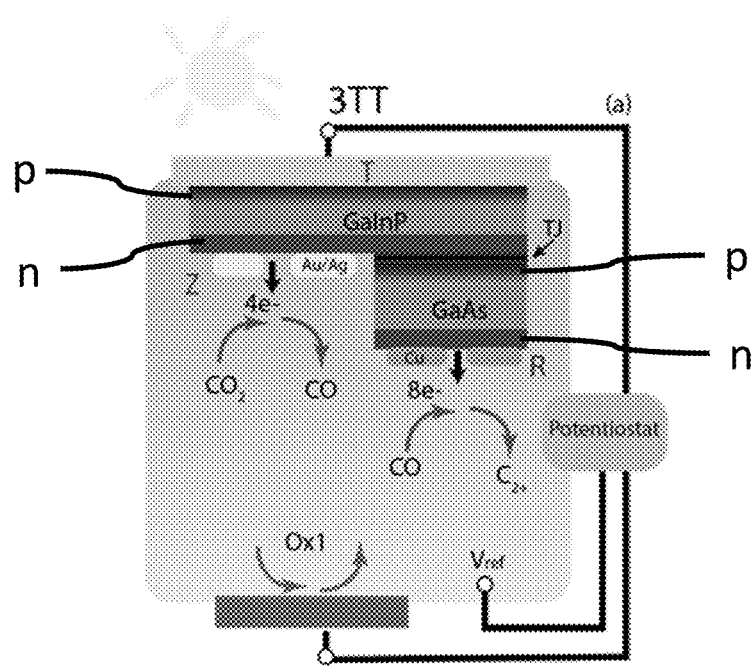
FIG. 1A provides a schematic of a GaInP/s/GaAs (p/n) three terminal tandem (3TT) PEC device. Shading indicates p-type doping and n-type doping (n-type bottom), and the cells are connected in series using a tunnel junction (TJ). Catalysts are coupled to the n-contacts of both sub-cells: Au is the middle contact (Z), and Cu is the bottom contact (R). Holes are extracted from the top (T) contact to drive the oxidation reaction at the counter electrode.

- 100 Photovoltaic device, e.g., GaInP
- 110 Photovoltaic device, e.g., GaAs
- 120 Catalyst, e.g., Au or Ag
- 125 First reaction, e.g., $CO_2 \rightarrow CO$
- 130 Catalyst, e.g., Cu
- 135 Second reaction, e.g., $CO \rightarrow C_2H_4$
- 140 Catalyst
- 145 Opposing reaction, e.g., $2H_2O \rightarrow 2H_2 + O_2$
- 150 Direction of light exposure
- 200 Electrode, e.g., photoelectrode such as GaInP/GaAs 2J
- 210 Polymer
- 220 Metal coated microsphere, e.g. Au catalyst
- 230 Metal coated microsphere, e.g. Cu catalyst
- 300 Substrate
- 310 Photovoltaic device, e.g., GaN or GaInP/GaAs
- 400 Doped photovoltaic device, e.g. GaInP
- 410 Doped photovoltaic device, e.g. Si
- 420 n+ doped region
- 430 p doped region
- 500 2J photovoltaic device, e.g. GaInP/GaAs

DETAILED DESCRIPTION

The embodiments described herein should not necessarily be construed as limited to addressing any of the particular problems or deficiencies discussed herein. References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

As used herein, "electronic communication" refers to a configuration in which electrical current, electrons or ions may be passed from one component to another. The two components may be in physical contact or connected via other means for the transfer of current or electrons, e.g., wires, etc.

As used herein, "RHE" refers to a reversible hydrogen electrode.

In an embodiment, methods and compositions are disclosed herein for a more general approach to using and making cascade photocatalytic devices that can drive any number of reaction steps, each with individual catalysts as well as potentials (using multijunction solar cell like architectures) and using light as the driver. The ability to use light allows use of solar irradiation, but also may offer advantages if sequences of monochromatic light can be used to sequentially activate different reaction steps.

Complex chemical reactions to produce fuels require multiple steps with different reaction intermediates, potentials, and ideal catalysts. In a light-driven system, lateral sequencing of photoelectrodes and charge extraction interfaces can be used to control the energy landscape spatially. Typically, a single catalyst type and a single voltage are used to drive a reaction, which limits product selectivity and reaction efficiency. To enhance catalytic selectivity using methods and compositions disclosed herein, we will add new degree of freedom to photo-driven catalyst microenvironment assemblies.

One way to realize this concept is by top-down patterning of multijunction solar cells with conformal, pre-patterned, charge extraction interfaces which will allow a different catalyst to be coupled to each absorber and thus operated at a different potential. In this way, multi-step reactions can be triggered on or off by supplying light of a specific wavelength to a reaction vessel, where that light can then activate a specific cell of the multijunction device, supplying a voltage coupled with the associated catalyst to perform a desired reaction step.

In an embodiment, a first reaction step can be triggered and run to completion by supplying red light, a second step can be triggered by supplying green light, and a third step by supplying blue light. This allows these reactions to proceed without complicated intermediate or back-reactions that occur when multiple steps are present in a single reaction vessel. In an embodiment, cascade photocatalytic devices can be used, for example, in promoting a $CO_2$ reduction reaction.

Figure 23:
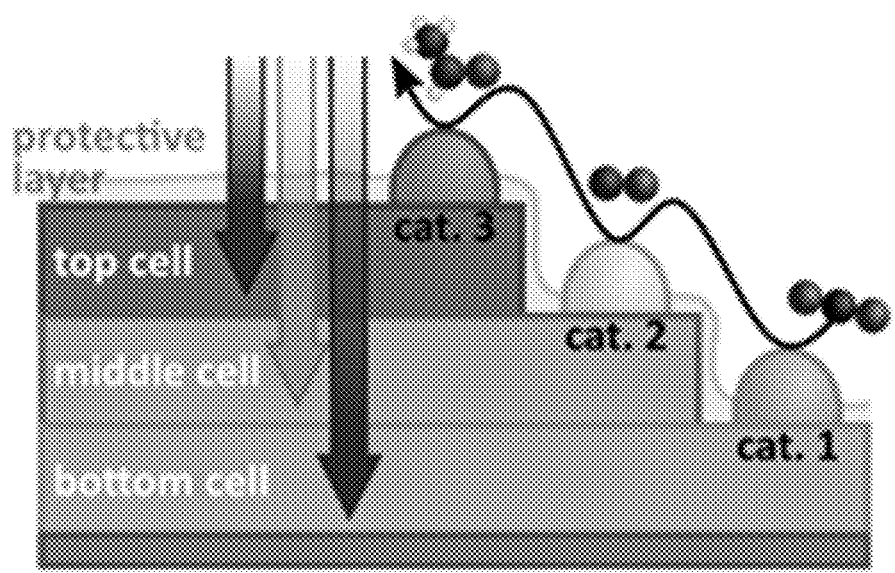
FIG. 23 illustrates top-down patterning of multijunction solar cells with a different catalyst couple to each absorber, providing an example utilizing three cells and three catalysts.

In a light-driven system, lateral sequencing of photoelectrodes and charge extraction interfaces can be used to control the energy landscape spatially. One way to realize this concept is by top-down patterning of multijunction solar cells with conformal, pre-patterned, charge extraction interfaces which will allow a different catalyst to be coupled to each absorber and thus operated at a different potential (see FIG. 23).

In an embodiment, different patterned dopants or absorber materials can be used on a surface to produce planar electrodes with laterally varying band gaps/band edges (similar to the process used to fabricate interdigitated back contact silicon PV cells). These designs will allow site activity to be tuned by temporally by adjusting the illumination spectrum.

Figure 24A:
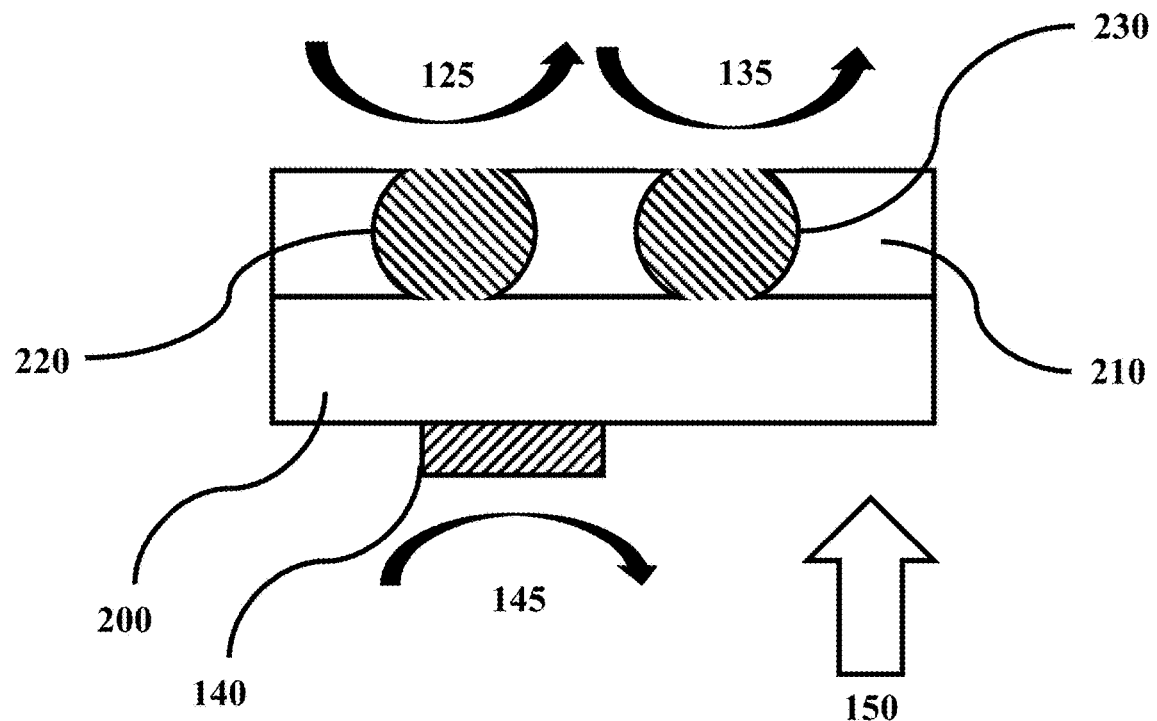
FIG. 24A depicts another embodiment wherein different catalytic metals are supplied as microspheres, which are supplied the same potential from the photovoltaic element. In an embodiment, the Transparent Conductive Adhesive (TCA) is metal coated compliant microspheres in an encapsulating matrix, using a mix of metals, and the photo electrode supplies at least 2V for the conversion of $CO_2$ to ethylene. TCAs are described further in Klein, T. et al, *Lamination of transparent conductive adhesives for tandem solar cell applications*, J. Phys. D: App. Phys. 54 (2021), 184002, which is hereby incorporated by reference in its entirety. In this embodiment, a removable top sheet is used in the lamination step so that metal microsphere surfaces are exposed to the chemical reaction environment.
Figure 24B:
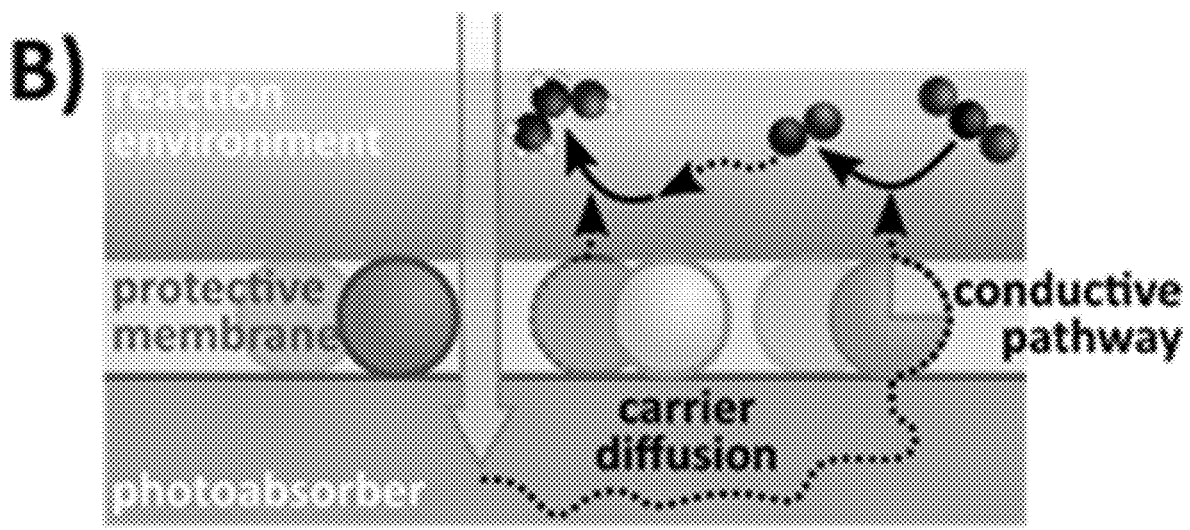
FIG. 24B provides a second example of a system utilizing TCAs.

A general platform for positioning different catalysts on a photoabsorber is possible using a protection coating composed of a polymer matrix with embedded catalytic microparticles of different types (see FIGS. 24A-24B).

FIG. 24 shows the use of a transparent, conductive encapsulant to achieve (1) multiple catalysts on the same semiconductor surface (e.g., Cu and Au), (2) protection of the underlying photovoltaic element by encapsulating the surfaces while still providing electrical conduction, and (3) a simple method to integrate both catalysts and surface protection. In contrast to the description in the Klein reference, our method for implementing this is to make sheets containing polymer (e.g. EVA) and metal microspheres (e.g. mix of Cu coated and Au coated), and laminate a photovoltaic element to a removable liner (e.g. Teflon) so that the liner can then be removed, exposing the top surface of the spheres.

Figure 25:
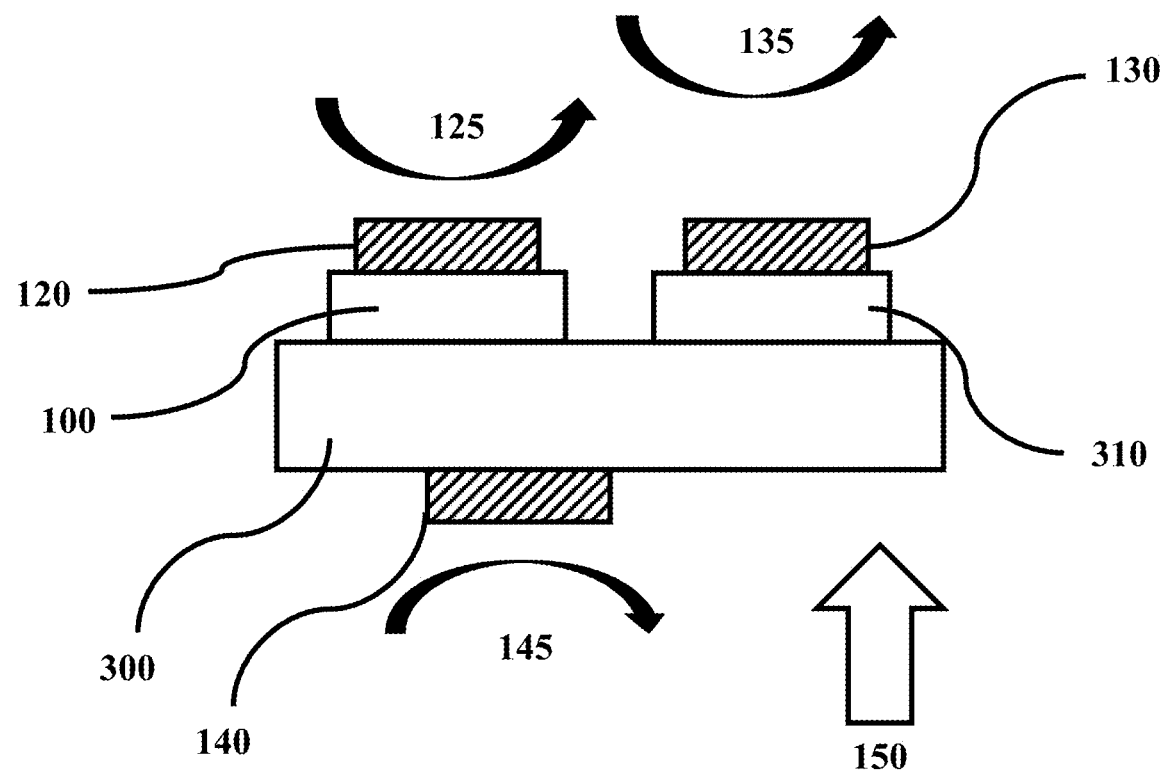
FIG. 25 depicts different photoabsorbers placed next to each other using selective area growth, pick and place, or other methods, sharing a conductive substrate. Also, any set or number of materials can be chosen according to the desired reaction, and the device(s) may be multijunction stack(s). The surfaces can also be passivated.

FIG. 25 shows the use of a set of photovoltaic elements that are more isolated than the ones described above. These could be separate PV mesas sharing a back contact (e.g. GaInP/GaAs PVs connected on a metal substrate), different PV elements assembled on a shared back contact using a method like pick and place or selective area growth (e.g. some GaInP cells and some GaN), or some different assembly method. In this case, each PV can be individually tailored to provide a precise current and voltage and there is no sharing of photocurrent, giving more control of the results.

Figure 26:
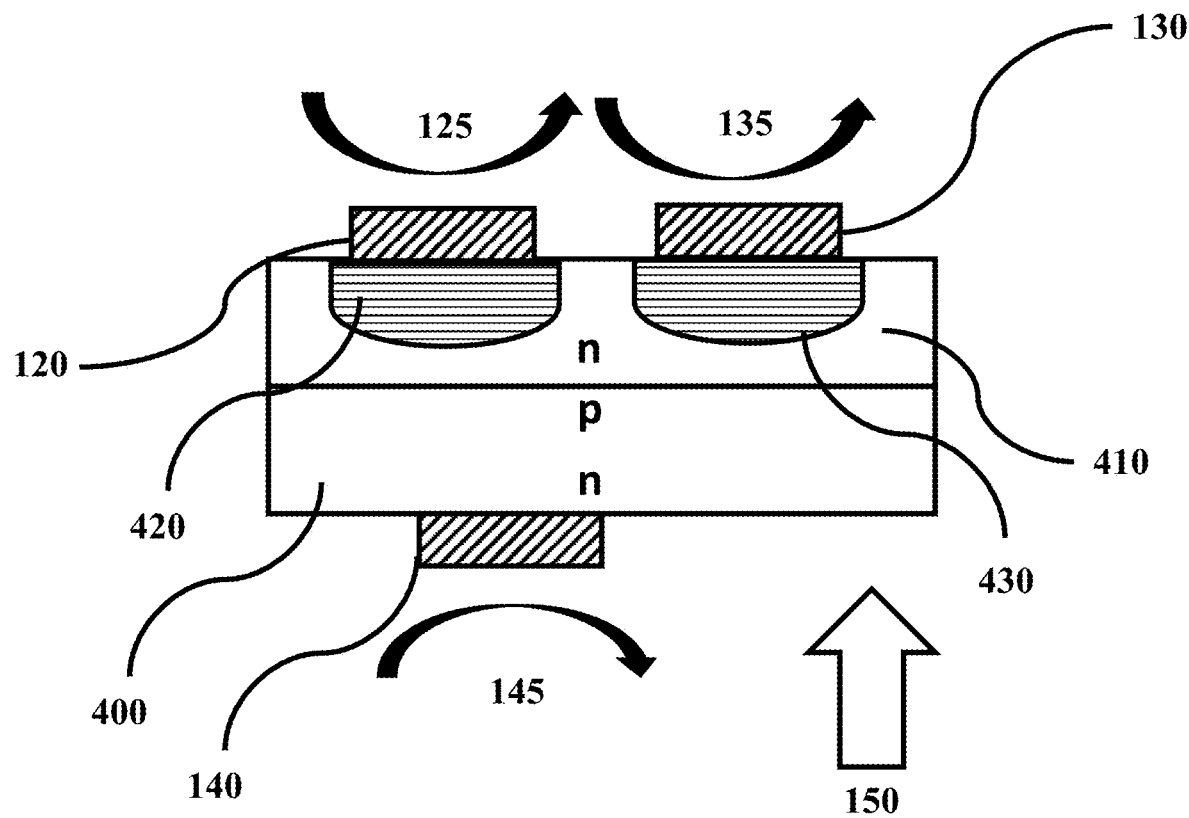
FIG. 26 depicts devices with a GaInP/s/nuIBC 3T tandem CT configuration. In an embodiment one of the catalysts in the device is Cu. nuIBC refers to a doped interdigitated back contact device, having p-doped regions and n-doped regions in contact with the various catalysts. This concept is described further in Warren, E. et al, A Taxonomy for Three-Terminal Tandem Solar Cells, ACS Energy Lett. 2020, 5, 1233-1242, which is hereby incorporated by reference in its entirety. In another embodiment, any single top cell may be used that has a band gap greater than 1.7 eV.
Figure 27:
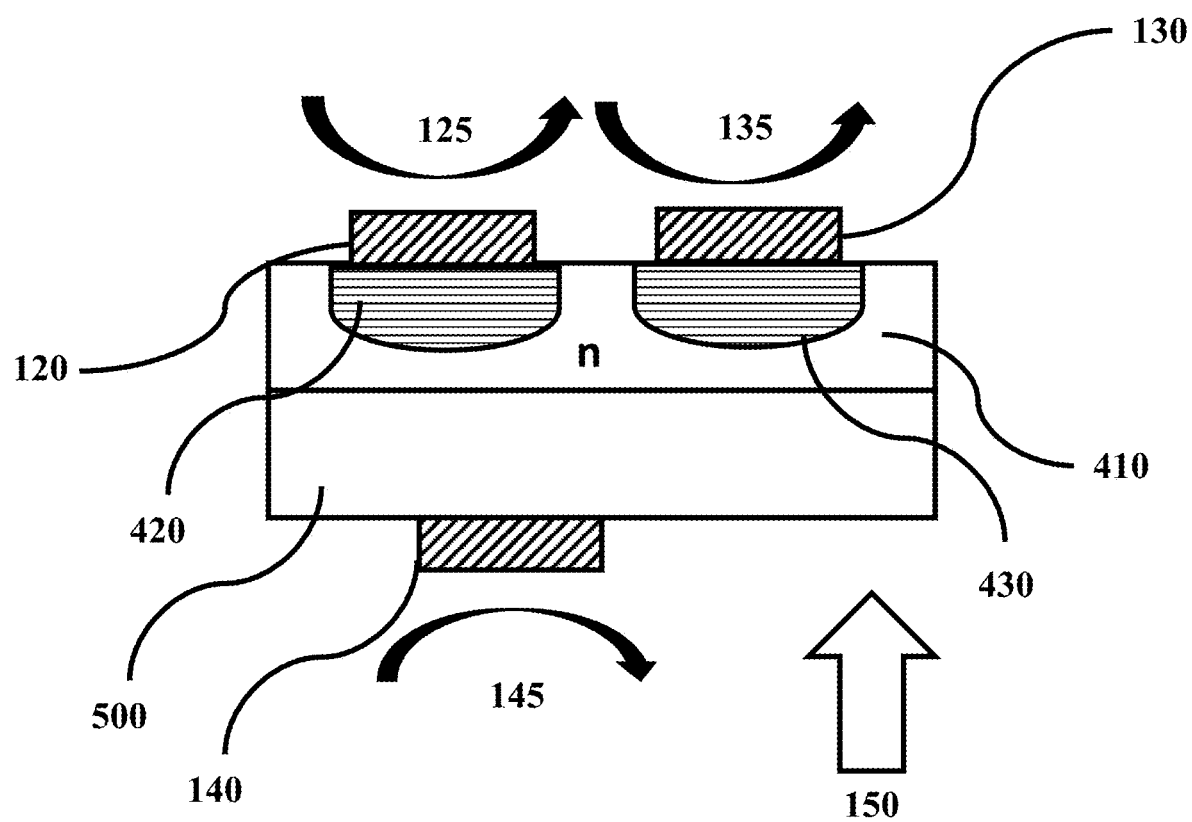
FIG. 27 depicts devices with GaInP/GaAs/s/nuIBC 3J 3T tandem wherein the voltages are larger than in FIG. 26. Any set of top cell materials may be used to form an overall triple junction structure. In another embodiment, more than 3 junctions may be used, for example four junctions.

FIGS. 26 and 27 are similar in that they use an IBC bottom cell (e.g. Si) and stack two (FIG. 26) or more (FIG. 27) top cells on top of that. The Si top surface provides the two contacts for different chemical steps and contributes to the photovoltage, but the top cells add voltage, with more cells stacked resulting in more voltage (but less current). Note that as drawn, the Si contacts are labeled as n-type and p-type, but there may be reasons to have multiple contacts of the same type but maybe different doping density or area, e.g. an n+ contact and an n++ contact to provide about the same voltage but different currents to different reactions steps. There could also be more than two. The top cell could be GaInP, GaInP/GaAs, or other more novel materials such as perovskites, $ZnSiP_2$, $ZnGeP_2$, $MgSnN_2$, $ZnTiN_2$, $In_xGa_{1-x}N$, other ternary phosphides and nitrides, etc.

In an embodiment, the devices disclosed herein are intended to be light-driven, and while the light source could be the sun, there may be advantages to using LEDs or other tunable light sources to get the ideal spectral conditions to drive reactions at the same rates. In an embodiment, the spectrum, timing (chopped light to drive reactions sequentially), and intensity (to change photovoltages and photocurrents) can all be varied.

In an embodiment, the devices disclosed herein include typical feature sizes in the 100 nm to 100 um range but may include larger ranges. In an embodiment, the ranges could be in the nanometer range. In another embodiment the ranges of the feature sizes could be in the millimeter range.

In an embodiment, the non-catalytic surfaces can be passivated and protected from corrosion using insulating layers. In an embodiment, a coating is added to protect the devices disclosed herein, similar to EVA in a photovoltaic module or a dielectric layer.

The provided discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

Example 1—Tandem Cascade Photoelectrochemical Devices for the Reduction of $CO_2$ to Ethylene Abstract Cascade photoelectrocatalysis (PEC) is a possible method to improve the selectivity of solar-driven $CO_2$ reduction ($CO_2R$). This concept can be realized by coupling different $CO_2R$ catalysts to different subcells in a multijunction photovoltaic (PV) stack. Efficient implementation requires careful tuning of the photocurrents and design of the photovoltages provided by the subcells to the $CO_2R$ catalysts in such a way as to facilitate the target reaction. Here, we outline the design principles of the tandem PEC approach using step conversion of $CO_2$ to ethylene in aqueous electrolyte, via a CO intermediate, as a model system. To perform this reaction, the first coupled PV-catalyst component should provide 4 electrons to reduce 2 molecules of $CO_2$ to CO; the second component should provide 8 electrons to reduce 2 CO molecules to $C_2H_4$. Based on known $CO_2R$ catalysts, the overpotential required to produce CO can be less than that required to reduce it to ethylene, creating the opportunity for improved efficiency. Cascade PEC can be realized in a three-terminal tandem (3TT) configuration using III-V-semiconductor based subcells coupled to Au (produces CO intermediate) and Cu (converts CO to ethylene). The current to each catalyst can be controlled by the area of the subcell exposed to the electrolyte, and the photovoltage is determined by the materials selected and device configuration. Operating conditions are found by simulating the coupled system using the open-source circuit simulator SPICE. We identify conditions under which a 3TT configuration can have a higher solar to chemical conversion efficiency compared to a two-terminal two-junction tandem (2T 2J) with the same absorbers and a Cu catalyst only. We also show that 3TT PEC devices can be less sensitive to variations in catalyst activity compared to 2T devices. Finally, we discuss the applications of cascade PEC to $CO_2$ reduction, using different intermediates, and to other chemical networks.

Introduction

Photocatalysis and photoelectrocatalysis are of interest to a number of technologies associated with sustainability including waste remediation, upcycling of plastics, solar water splitting, and solar carbon dioxide reduction. Some of the underlying chemical transformations associated with these processes are comparatively simple: for example, in water splitting there are limited pathways for unwanted byproducts and separation is simplified by the fact that the products are insoluble gases. In other cases, selective generation of the target products remains an unmet challenge. In nearly all forms of prospectively sustainable $CO_2$ reduction operating near room temperature—photocatalytic, electrocatalytic, and photoelectrocatalytic—it is currently not possible to make a single, separable, product with high yield and selectivity.

Focusing on electrocatalytic (EC) and photoelectrocatalytic (PEC) reduction of $CO_2$ ($CO_2R$), most known methods employ a single catalyst biased at a single potential during operation, with significant attention paid to the structure and environment of the active site, the binding energies of key intermediate species and the activation barriers between them, and the management of the fluxes of reactants and products. However, in biological processes such as the oxidation of carbohydrates in respiration or their formation in photosynthesis, reaction networks consisting of cascades of individual steps are used to produce products selectively, avoiding deleterious by-products. With this concept as inspiration, $CO_2R$ cascades have been reported using homogeneous catalysts and $H_2$ or NADPH as the reductant and coupling of PEC $CO_2R$ with enzymes has been proposed as a pathway to $C_3$ and higher order products. Recently, a number of studies have investigated tandem cascade EC-$CO_2R$ using bimetallic catalysts, often coupling a CO-producing metal such as Ag with Cu, which is capable of producing $C_2+$ products using either CO or $CO_2$ as a precursor. This concept has also been used in flow reactors and tandem cascade Ag—Cu catalysts have been integrated with photocathodes to perform overall, solar-driven $CO_2$ reduction with modest conversion efficiency.

The individual electrocatalysts in the cascade EC and PEC $CO_2R$ in the art have generally been operated at a single potential. Given that the products of EC-$CO_2R$ can vary widely with the applied potential, the question naturally arises as to whether selectivity could be employed by operating the constituent electrocatalysts in the cascade at different potentials. It is generally agreed that CO is an intermediate for $CO_2$ reduction to $C_2$ products on copper, and it is also known that CO conversion on Cu requires a lower overpotential than $CO_2$ conversion on Cu. This leads to the conclusion that coupling a CO-producing catalyst operated at a different, lower potential could lead to increases in energy conversion efficiency for $C_{2+}$ products.

The present application describes design principles of a PEC system which allow the catalysts in a tandem cascade to be operated at different potentials. We show that three-terminal tandem (3TT) photovoltaic (PV) devices, which can provide different photovoltages and photocurrents at different cell contacts, depending on the device geometry and measurement configuration and allow this concept to be realized. We examine a model system of $CO_2$ reduction to ethylene through a CO intermediate to illustrate the use of 3TT PEC devices for $CO_2R$. Experiments have shown low overpotentials required to reduce $CO_2$ to CO on Au nanoparticles. Thus, coupling a Au-based catalyst to the middle (Z) contact could take advantage of the low overpotential by first reducing $CO_2$ to CO in a low potential region then proceeding to reduce the CO in another region of higher potential using a Cu-based catalyst.

First, described herein is a model 3TT PEC system in a configuration that has voltage additivity like a normal tandem but can split the currents between a 1J and 2J region, which is suitable for driving a two-step tandem cascade, and calculate the current density in each of the subcells as a function of applied bias. We show that for $CO_2$ conversion to ethylene through a CO intermediate, this device may have a higher solar to chemical conversion efficiency compared to single catalyst devices on either single or tandem absorbers depending on electrochemical behavior and selectivity. Next, we show how the design can be optimized for specific catalyst activities by adjusting the effective areas of the subcells. Finally, we outline the principles and design for 3TT PEC devices in general and discuss possible applications to $CO_2$ reduction using different intermediates and to other chemical networks as well as looking into the time domain.

Results

Simulation Overview

Our model focuses on the electrical and catalytic behavior of a 3TT device, and for simplicity does not include mass transport or thermal effects. The specific configurations we simulate are shown schematically in FIG. 1. FIG. 1A shows the 3TT model system of interest.

For the 2T cases, the single junction device has one GaInP PV component, and the two-junction device has two PV components, GaInP and GaAs, connected in series for voltage additivity. These subcells are current matched and have equal area. Holes collected at the p-type top contact (T) can drive water oxidation at the counter electrode. In the 2T configurations, electrons can be extracted to drive reduction reactions in solution at the n-type back contact (R). For these simulations, Cu-like $CO_2$ reducing catalyst will serve as the back contact.

For the 3TT case, using nomenclature developed by Warren et al, the schematic shown in FIG. 1A is "GaInP/s/GaAs(p/n) 3TT," designating a series connection of two cells with p/n polarity for both cells. The photovoltaic elements are GaAs (bottom cell) and GaInP (top cell) where top/bottom refer to the order in which the cells absorb light. For the 3TT, as shown in FIG. 1A, the GaAs has a smaller area than the GaInP, allowing for current splitting with the middle contact. Electrons can be extracted at the n-type middle contact (Z) from the GaInP and at the n-type back contact (R) from the GaAs, with the potential at the latter contact being more negative. This contact configuration is analogous to a "common T" or CT test configuration from Warren et al, as the T contact is shared as the counter electrode. The CT configuration generates the highest voltages at the remaining two contacts (R and Z). In this configuration, all of the photocurrent passes through the GaInP top cell, which is split between the middle and bottom contacts. For the simulations, a
Au-like CO producing catalyst was placed on the GaInP contact and a Cu-like CO reducing catalyst was placed on the GaAs.

Two-step conversion of $CO_2$ to ethylene proceeds through the following two electrochemical half reactions:

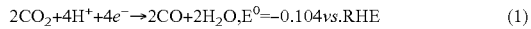

$$2CO_2 + 4H^+ + 4e^- \rightarrow 2CO + 2H_2O, E^0 = -0.104\, vs.\text{RHE} \quad (1)$$

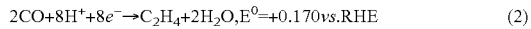

$$2CO + 8H^+ + 8e^- \rightarrow C_2H_4 + 2H_2O, E^0 = +0.170\, vs.\text{RHE} \quad (2)$$

At the same time, Cu is capable of $C_2H_4$ production directly from $CO_2$, without externally supplied CO:

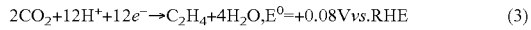

$$2CO_2 + 12H^+ + 12e^- \rightarrow C_2H_4 + 4H_2O, E^0 = +0.08V\, vs.\text{RHE} \quad (3)$$

Figure 9:
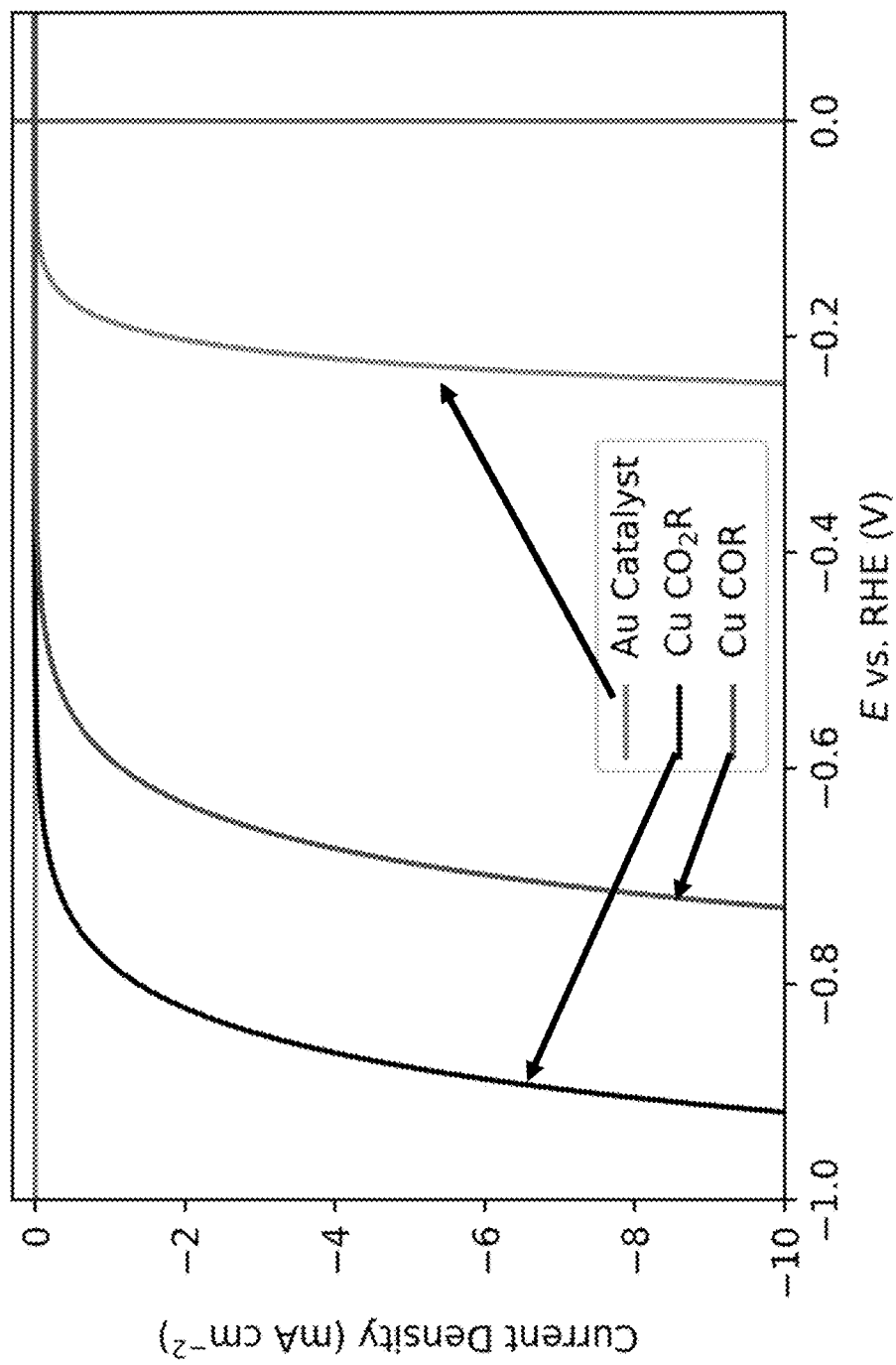
FIG. 9 provides the current model for the catalysts used in the simulation described herein. Data for Au and COR synthesized from exchange current and Tafel slopes. These parameters were placed into a Butler Volmer model, to generate the two curves. These curves represent total current densities, faradaic efficiencies are listed in Table 1. The current densities used in the simulations map onto experiments performed in near-neutral pH in $CO_2$-saturated water. We define the onset as that required to produce a current density of 0.1 mA $cm^{-2}$; here, for Cu and Au these values are −0.65 V ($CO_2R$), −0.45 V (COR), and −0.15 V vs RHE, respectively.

We refer to reactions 1 and 2 as the cascade mechanism and we refer to reaction 3 as direct conversion. As an illustrative base case, the total current density-voltage behavior of Au (reaction 1), and COR (reaction 2) and $CO_2R$ (reaction 3) on Cu were simulated by assuming Butler-Volmer kinetics as shown FIG. 9. Importantly, in these reports, the onset potential for $CO_2$ reduction to CO on Au is less negative (kinetically more favorable/occurring at a lower overpotential) than CO reduction on Cu (−0.15 V compared to −0.45 V) (all voltages described herein are simulated). The current densities used in the simulations (0-14 mA cm$^{-2}$) map onto experiments performed in near-neutral pH in $CO_2$-saturated water; these current densities are conservative estimates of typical 1-sun short circuit current densities of GaInP/GaAs tandem solar cells. For both catalysts, we will neglect the competing hydrogen evolution reaction (which can have an FE as low as 10% on Cu) such that all current is used for $CO_2$ reduction; assumptions regarding the faradaic efficiencies to the different C-containing products will be discussed below. We also assume that the CO produced at the Au catalyst will be available for further conversion at the Cu; prior experimental work has shown this diffusion or convective-mediated pathway can be very efficient. Throughout this example, we assume a 1 cm$^2$ electrode area, and reduce the GaAs area proportionally to vary the current ratios.

Figure 1B:
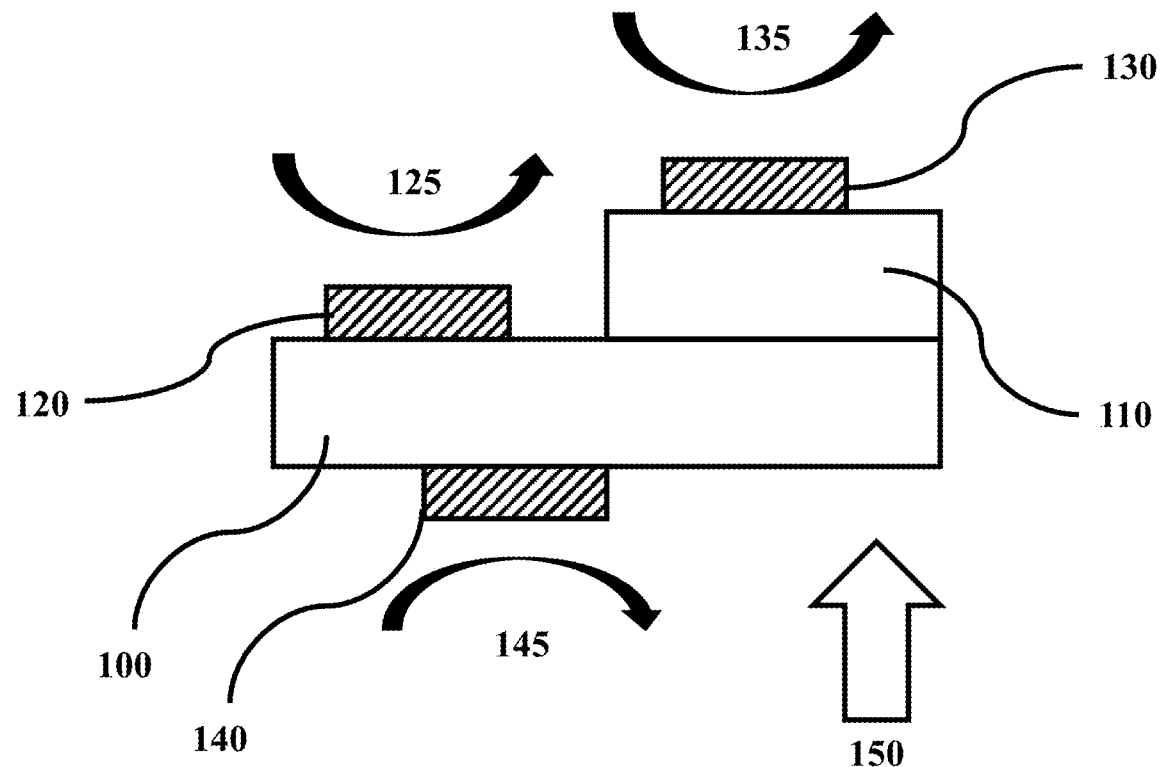
FIG. 1B depicts a 2J 3T solar cell structure more generally illustrative of the device shown in FIG. 1A. The spectrum of incident light can be tuned. The layer thickness can be tuned to get correct currents to drive reactions at the same rate. In an embodiment, more complex reactions using more complex structures with more junctions or different materials can be used to change the voltages. The area of the catalyst can also be changed to tune for different balanced reactions.
Figure 10:
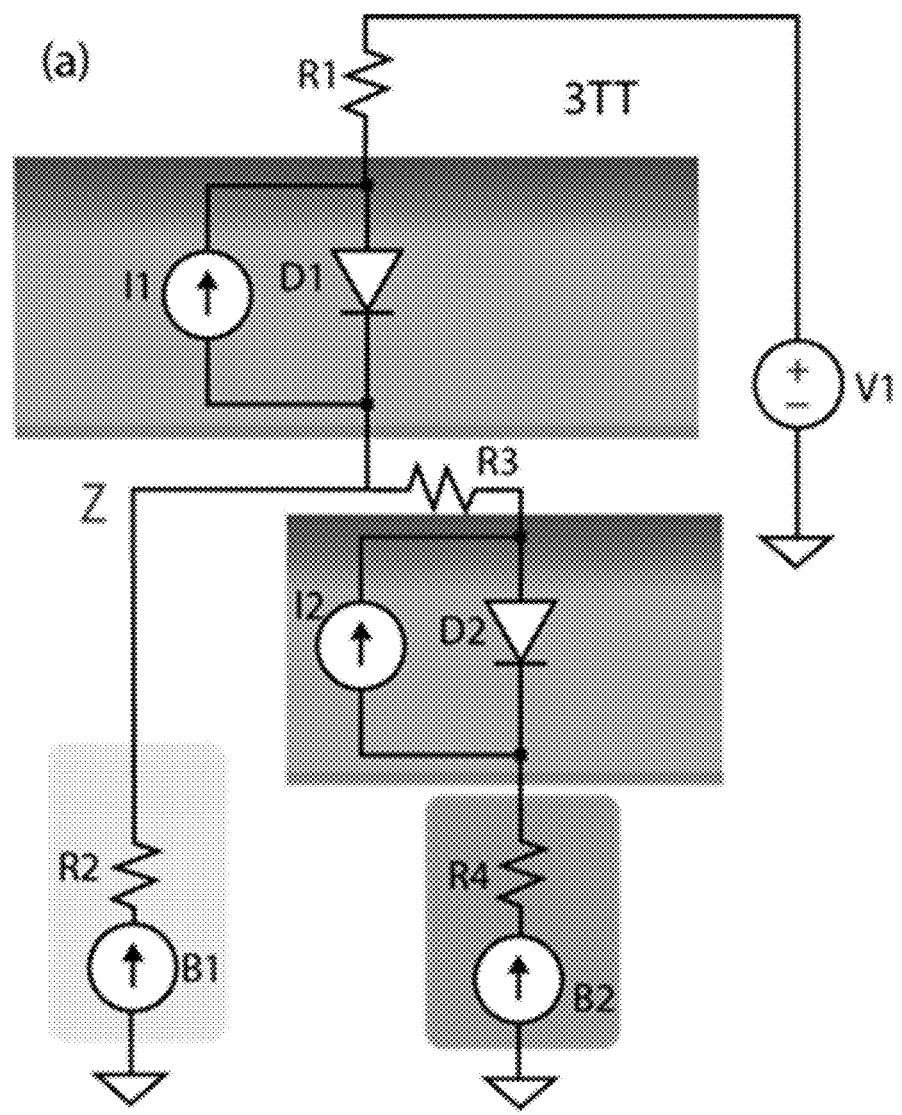
FIG. 10 provides a schematic of equivalent circuit for the three terminal tandem cell used in SPICE simulation. In the diagram the PV elements are the current source and the diode, the reverse saturation current of D1 (GaInP) and D2 (GaAs) were adjusted to produce an open circuit voltage of 1.4 V for GaInP and 1.0 V for GaAs with $j_{sc}$ being 12 mA $cm^{-2}$. B1 and B2 are non-linear voltage-controlled current sources meant to represent the Au and Cu catalysts, respectively.

The equivalent circuits of the schematic shown in FIG. 1 is shown in FIG. 10. Because the potential between the cell's T contact and the reference is set by the potentiostat and the R and Z contacts are constrained to each other via the solution, the cell's behavior can be represented as a single I-V curve (contrary to a contour plot for a 3TT photovoltaic device) which we simulated using a SPICE circuit simulator. When configured in a two terminal tandem (2T 2J) configuration, a GaInP/GaAs tandem typically has a $J_{sc}$ value of 14 mA cm$^{-2}$ with a $V_{oc}$ of 2.5 V, with the GaInP cell being current limiting. For a 3TT configuration, the current matching condition is relaxed as the top cell current can be split between the middle (Z) and bottom (R) contacts. As a starting point for the simulation of a 1 cm$^2$ cell, we assumed that the GaInP cell has a 1-sun $I_{sc}$ of 12 mA and a $V_{oc}$ of 1.4 V, and that the GaAs (with an illuminated area of 0.625 cm$^2$) cell has an $I_{sc}$ of 7.5 mA and a $V_{oc}$ of 1.0 V.

In the provided model, we tune the currents of the subcells by varying their generation currents, which is representative of changing their areas/thickness or varying the spectral conditions. For this work, the $I_{sc}$ of the GaAs cell will be adjusted by varying its area proportionally to a current density of 12 mA cm$^{-2}$ (7.5 mA corresponds to 0.625 cm$^2$). Thus, in the 2T 2J case, the areas will be equal and current matched. Given the current densities predicted by the SPICE simulations, product production rates were calculated based on expected faradaic efficiencies for Au and Cu catalysts. While Au is selective for production of CO, the $CO_2R/COR$ product distribution produced by Cu depends strongly on potential. Moreover, on Cu the onset potential for reaction (2), CO reduction to $C_2H_4$, is known to be less negative than reaction (3), $CO_2$ reduction to the same product. The base case 3TT design (FIG. 1A) the potential range in which both catalysts are producing products corresponds to the potential range where the 2J/Cu region is operating at its light-limited current. For the base case simulation of the 3TT, we capture the improved performance of COR by increasing its faradaic efficiency toward ethylene (85% for COR and 50% for $CO_2R$). Discussed herein is how this behavior changes as we vary the activity of $CO_2R$ relative to COR. Due to the non-linear current-voltage behavior of the catalysts, and the fact that Cu can also produce ethylene directly, behavior may be complicated.

TABLE 1

Figure 11A:
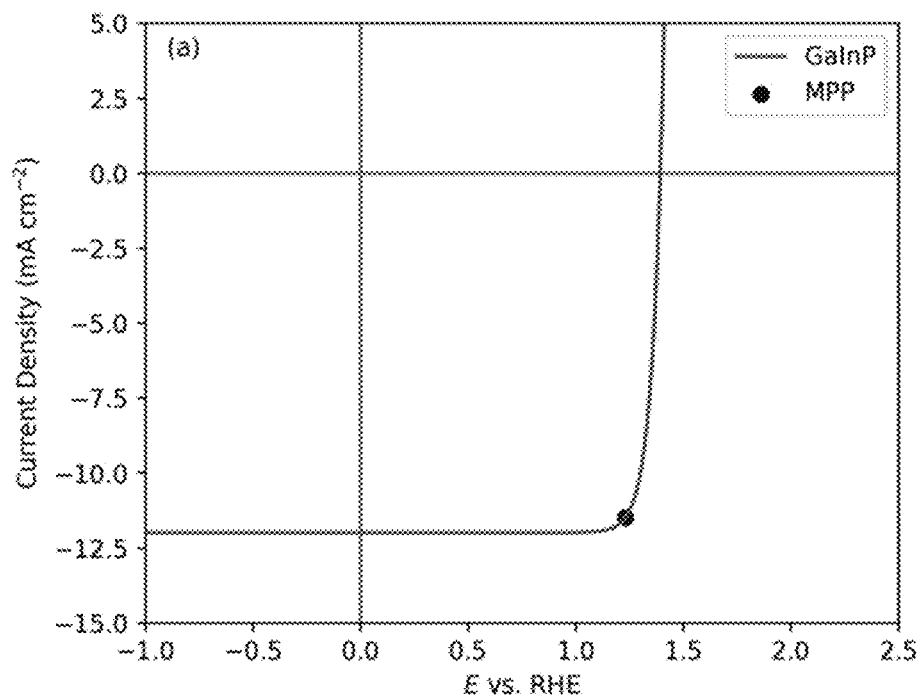
FIGS. 11A-11B show J-V behavior of the PV elements used in the cells under 1 sun.
Figure 11B:
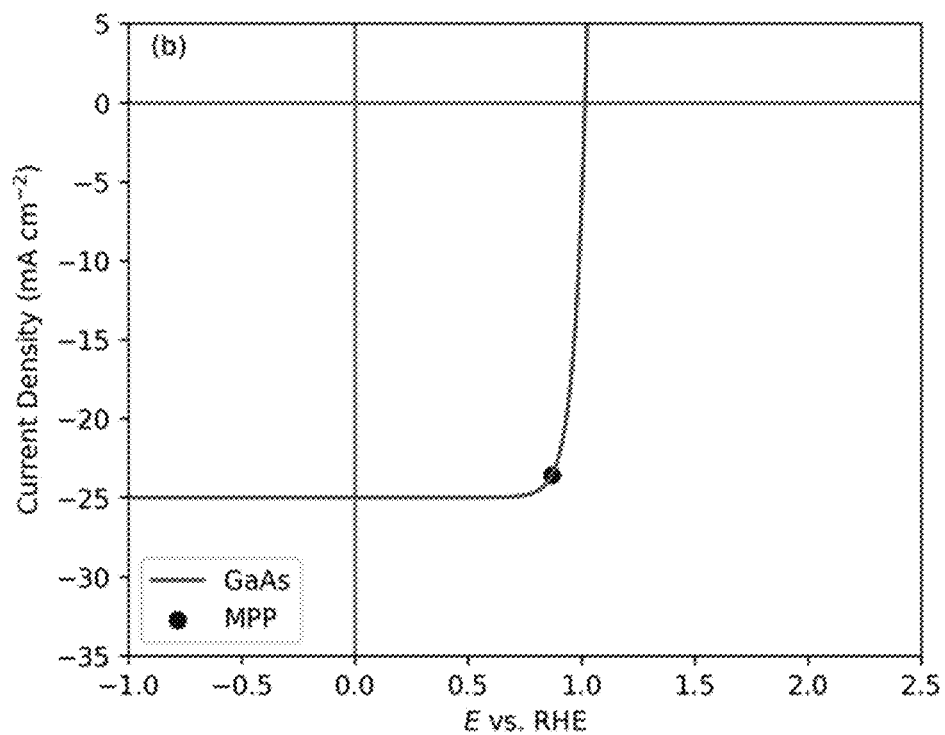

Summary of the parameters used for the base case simulation of a 1 cm2 3TT PEC cell. More details about the PV model inputs and 1-sun J-V in Table 2 and in FIG. 11.

| (Sub)Cell | $I_{sc}$ (mA) | Area (cm$^2$) | $V_{oc}$ (V) | Fill Factor | FE (%) | Dark Onset (V vs RHE) |
|---|---|---|---|---|---|---|
| GaInP/Au | 12 | 1 | 1.4 | 0.88 | CO: 100 | −0.15 ($CO_2$ -> CO) |
| GaAs/Cu | 7.5 | 0.625 | 1.0 | 0.85 | $C_2H_4$: 85 (COR) | −0.45 (COR) |
| | | | | | $C_2H_4$: 50 ($CO_2R$) | −0.65 ($CO_2R$) |

TABLE 2

Summary of parameters used in the base case SPICE model to the GaInP and GaAs PV elements

| GaInP | Model Parameter | GaAs | Model Parameter |
|---|---|---|---|
| I1 | −12 mA | I2 | −7.5 mA |
| D1 | Is = 0.02 pA; n = 2; Rs = 0 Ohm | D2 | Is = 64 pA; n = 2; Rs = 0 Ohm |
| R1 | 0 Ohm | R2 | 0 Ohm |

Simulation Results

Figure 2A:
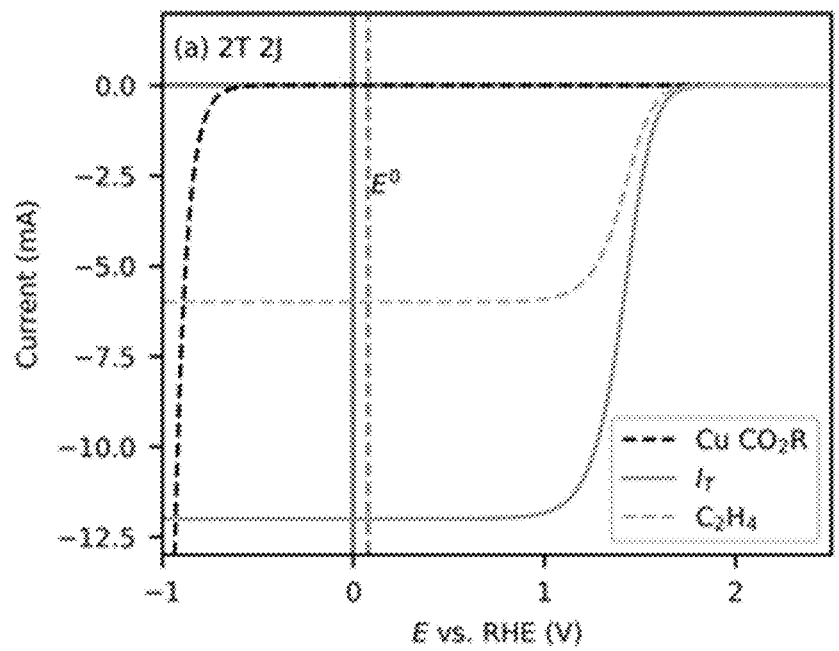
FIG. 2A provides current density-voltage (I-V) behavior for the 2T 2J device using parameters described herein: $I_T$. $E^0$ for $CO_2R$ to ethylene (dashed grey line), reaction (3), and the assumed I-V behavior of Cu in the dark, i.e., without being coupled to solar cells (dashed black line). The dashed yellow curve is the partial current density to ethylene.
Figure 2B:
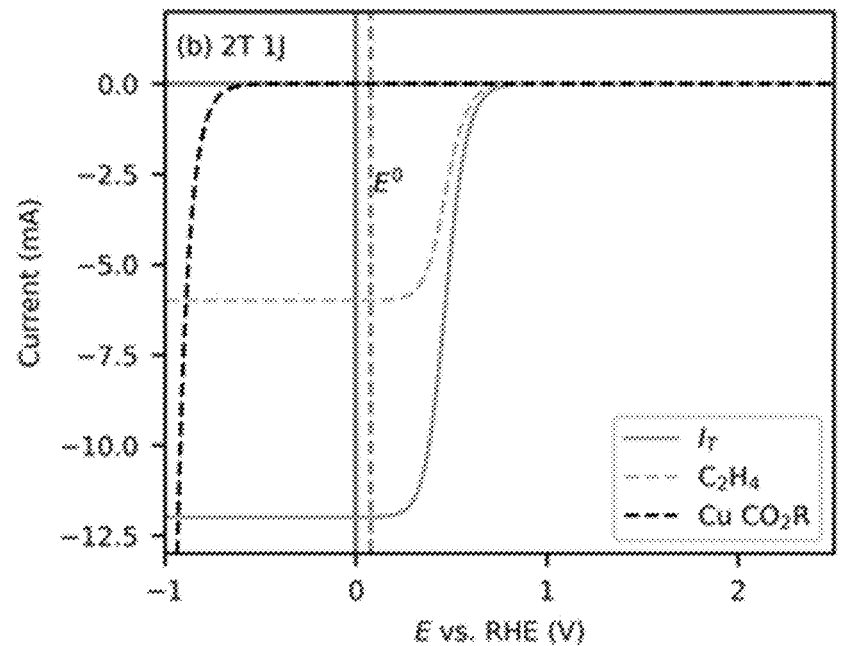
FIG. 2B provides current density-voltage (I-V) behavior for the 2T 1J (GaInP) device using parameters described herein.

We first simulate the I-V behavior of the two-terminal devices to establish a comparison. The I-V behavior of the reduction half-cell in the 2T configurations are shown in FIGS. 2A-2B. Onset of photocurrent occurs at +1.75 V vs RHE, and comparison of the dark and light curves in FIG. 2A shows that the solar cell provides about 2.4 V as seen by the onset difference between the light and dark curves. This shows the voltage additivity seen in tandem PV. The ethylene curve represents the partial current toward ethylene, and because the assumed faradaic efficiency to ethylene is 50% this curve is simply half the photocurrent. For the 2T 1J case shown in FIG. 2B, the photocurrent onset is at +0.75 V vs RHE, showing that the solar cell only provides 1.4 V as expected because there is only one photoabsorber to generate voltage. The low voltage and high overpotentials for $CO_2R$ on Cu make the 2T 1J configuration less favorable; the 2T 2J case does provide significantly greater voltage, but the chemical reaction proceeds via a less selective pathway (reaction 3). Thus, we simulate the 3TT case, which we expect to enable the cascade mechanism, taking advantage of greater selectivity and lower overpotentials for $CO_2R$ on Au.

Figure 3A:
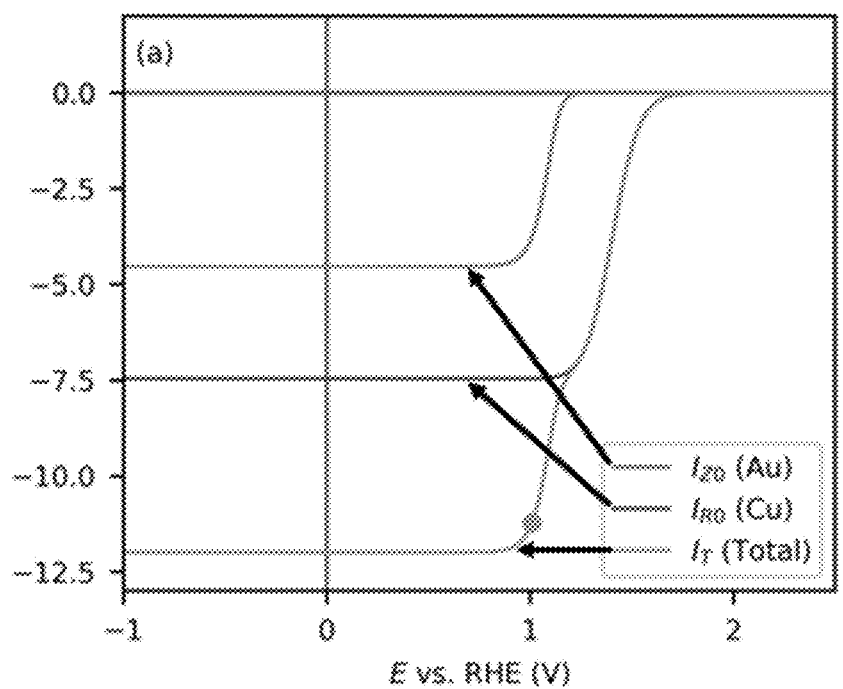
FIG. 3A provides Current density-voltage (I-V) behavior for the 3TT schematic shown in FIG. 1A using the parameters in Table 1: $I_{Z0}$ (GaInP/Au), $I_{R0}$ (GaInP/GaAs/Cu); $I_T$ (total) (note that the total curve and the GaInP/GaAs/Cu curves overlap for E greater than +1.25 V vs RHE). The circle is the cascade operating point, discussed herein.

We simulate the I-V behavior of the 3TT PEC $CO_2$ reduction half-cell (FIG. 3A) using the parameters summarized in Table 1. Note that in a physical experiment, the potentiostat would measure $I_T$ or the total current, but the simulation allows us to access the subcircuit behavior. The behavior of the coupled cells is best discussed starting at the point of current onset, which is +1.75 V vs. RHE, the same as with the 2T 2J case. As the potential is swept to more negative values, initially, all the current goes through both cells to the Cu catalyst (Cu overlaps the total current density); that is, $I_{TZ}=0$. The current onset for cascade conversion is at +1.25 V vs. RHE where CO production starts from the Au connected to the GaInP cell, allowing the copper contact to begin converting CO via reaction (2). The total current density reaches the current limit set by the GaInP cell, −12 mA cm$^{-2}$, at +0.9 V vs RHE.

Figure 3B:
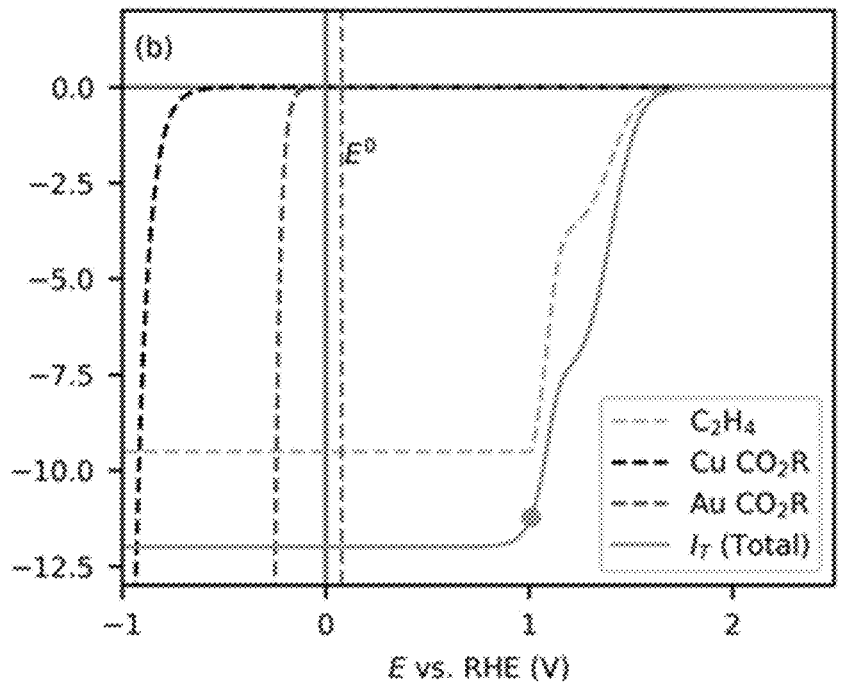
FIG. 3B shows chemical behavior of the cell, $E^0$ for $CO_2R$ to ethylene (dashed grey line), reaction (3), and the assumed I-V behavior of Cu and Au in the dark, i.e., without being coupled to solar cells. The light grey dashed curve is the partial current density to ethylene.

The partial current density to ethylene is shown in the light grey dashed line in FIG. 3B. When only the Cu pathway is operating via reaction (3), from +1.75 to +1.25 V vs RHE, ethylene is half the total current density corresponding to the assumed FE of 50% (Table 1). However, the ethylene partial current density increases sharply in magnitude when the cascade mechanism becomes possible at +1.25 V vs RHE. Its limiting value is −9.5 mA cm$^{-2}$ for potentials of 1.05 V and below; in this potential range the $CO_2$ reduction to ethylene proceeds completely through the cascade mechanism (reactions 1 and 2).

Figure 12:
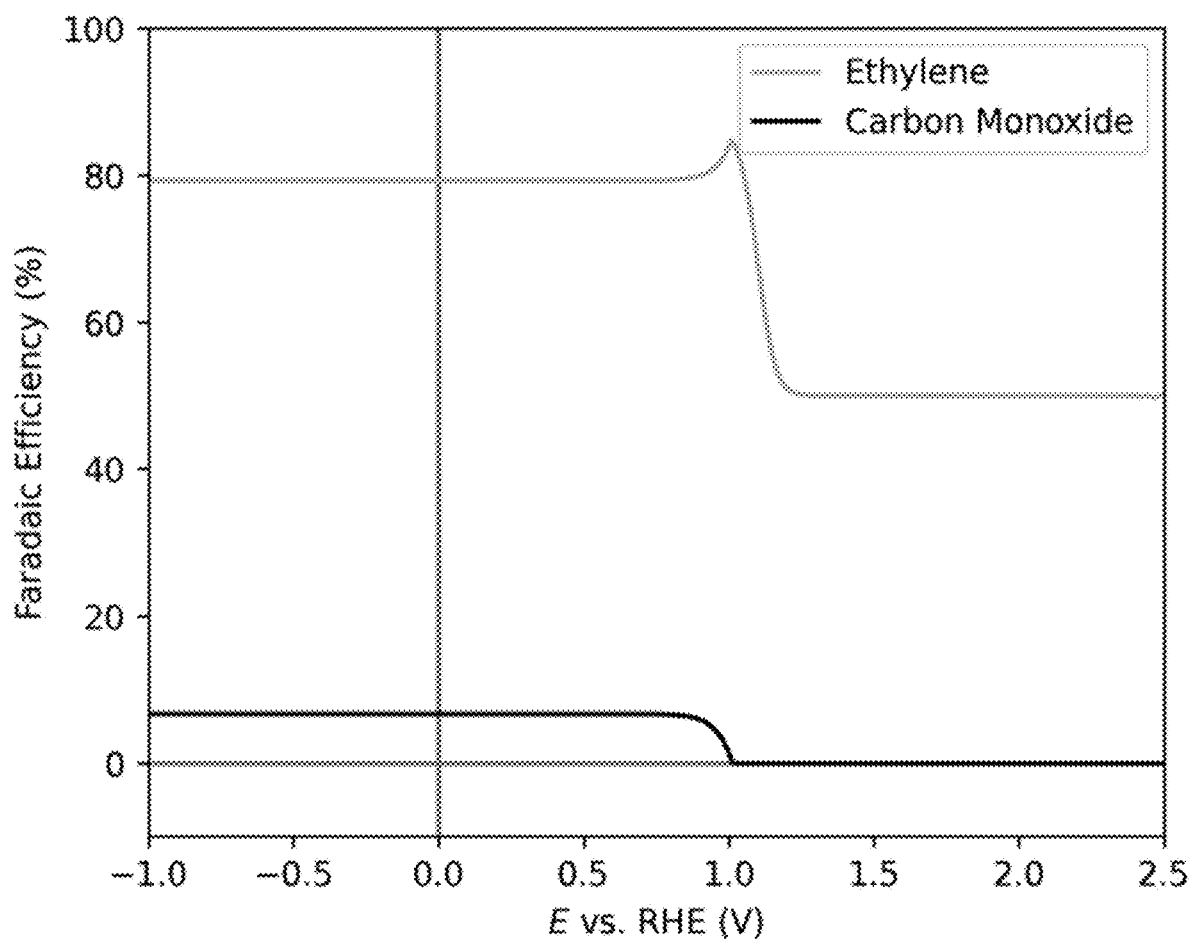
FIG. 12 shows the faradaic efficiencies toward CO and ethylene as a function of the bias for a three-terminal tandem (3TT) photoelectrochemical device, with the circuit shown in FIG. 9A. The parameters for this simulation are shown in Table 1.

The cascade operating point, indicated as a dot in the figures, is defined as the most positively biased point where all ethylene production proceeds by the cascade mechanism. At this point, the faradaic efficiency for ethylene is at its maximum and the net production of CO is zero (FIG. 12). As discussed herein, the cascade operating point in this case also corresponds to the maximum solar conversion efficiency for production of ethylene. Further reducing the bias past the cascade operating point increases CO production, but not ethylene, decreasing the faradaic efficiency of ethylene (FIG. 12).

FIG. 3 reveals additional details of the behavior of the coupled subcells. The GaInP cell supplies the current for both cells, hence the $I_{sc}$ for the GaInP cell is the total limiting current. The GaAs cell determines the distribution of current as the $I_{sc}$ for the GaAs cell is the limiting current for the Cu catalyst (there are exceptions to this which will be discussed below). The $V_{oc}$ for the GaInP/GaAs tandem can be seen as the difference between the onset of the dark curve for Cu (dashed line) and the onset of the cyan/green curve at +1.75 V vs. RHE. The $V_{oc}$ for the GaInP cell by itself is the difference between the current onset for the Au catalyst in the dark (−0.15 V vs RHE, FIG. 3) and the Au curve in FIG. 2. The cascade operating point (dot) depends on the overpotential for the Au catalyst; a lower overpotential would shift this point to more positive values. As will be discussed herein, the cascade operating point is comparatively less sensitive to the overpotential for the Cu catalyst.

Solar to Chemical Conversion Efficiency

To determine optimal parameters for cell design and operation and to assess trade-offs, we use the applied bias photon-to-current ($\Phi_{ABPC}$) efficiency:

$$\Phi_{ABPC} = \frac{\Delta G_{product} \cdot \frac{J}{nF} \cdot (FE) - J(E - E^0)}{P_{sun}} \quad (4)$$

where ΔG is the free energy change for the reduction half reaction, n is the number of electrons transferred, J is the current density (normalized to the GaInP cell area), F is faraday's constant, FE is the faradaic efficiency toward the product, E is the operating potential, E$^0$ is the standard reduction potential for the half reaction, and sun is $P_{sun}$ the solar intensity. This metric captures the difference between the power going to the target chemical minus any added electrical power and is normalized to the incident light intensity. It can also be thought of as the theoretical maximum solar to chemical conversion efficiency of the full cell in the limit of zero overpotential for the water oxidation reaction at the counter electrode. Graphically, $\Phi_{ABPC}$ will be positive for regions of the I-V curves where the partial current density for ethylene is negative and the power generated from the positive bias is greater than energy decrease from the downhill half reaction.

Figure 4A:
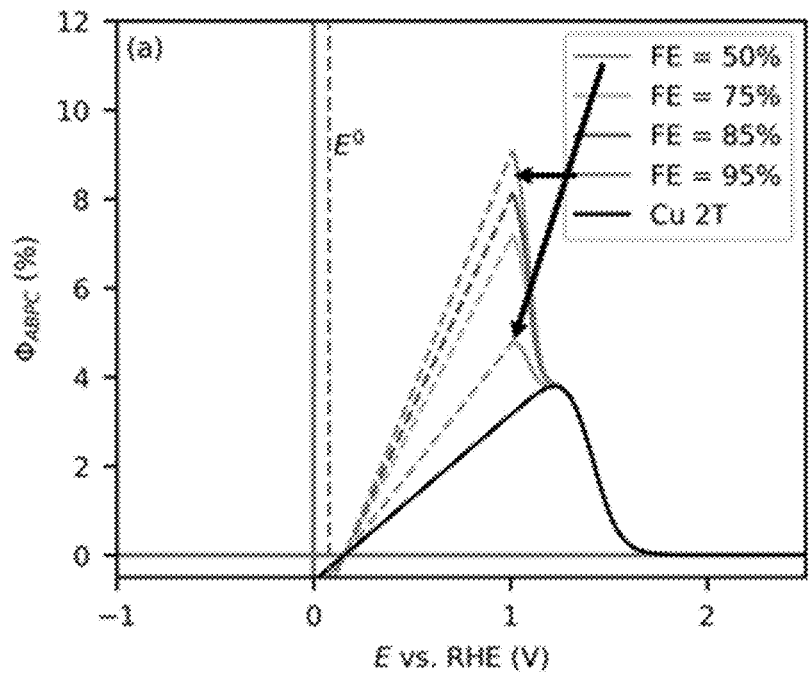
FIG. 4A shows $\Phi_{ABPC}$ for ethylene production (Eq. 4) for the 3TT cell shown in FIG. 1A, the GaInP/GaAs/Cu cell only ($I_{TZ}=0$), and for different values for the FE for CO conversion to ethylene (50-95%). Dashed lines indicate the region where there is no further ethylene production with decreasing potential.

$\Phi_{ABPC}$ as a function of applied bias is shown in FIG. 4a assuming a 1-sun AM1.5G intensity of 100 mW cm$^{-2}$. Data for the base case ethylene FE (85%) (Table 1) for the COR reaction is shown as well as data for smaller and larger values. Starting at positive values of the bias voltage and sweeping to more negative values, $\Phi_{ABPC}$ becomes positive at +1.75 V vs RHE, corresponding to the onset of ethylene production by the Cu catalyst driven by both cells. For the base case (Table 1), the $\Phi_{ABPC}$ for direct conversion of $CO_2$ to ethylene reaches 4% at +1.3 V vs RHE. $\Phi_{ABPC}$ increases sharply when the cascade mechanism becomes possible at +1.25 V vs RHE. The maximum conversion efficiency reaches 8.3% at E=1.05 V vs. RHE for 85% FE; this point is the cascade operating point in FIG. 3a and is a condition which is similar to the maximum power point (MPP) of a solar cell. At more negative bias, $\Phi_{ABPC}$ decreases linearly (FIG. 4A, dashed lines).

There are two interesting features in FIG. 4A. First, we note the sharp drop in $\Phi_{ABPC}$ at +1.05 V vs RHE for cascade mechanisms regardless of assumed FE. This is due to ethylene production being determined by the current available to the Cu catalyst; if more CO is produced than Cu can reduce to ethylene, it is not possible to convert it. Therefore, for potentials more negative than the point of maximum $\Phi_{ABPC}$/cascade operating point, the additional CO produced is not converted to ethylene and the ethylene current saturates, leading to the linear decrease in $\Phi_{ABPC}$ in this region. (As shown by the dashed lines in FIG. 4A). Secondly, the small dip between +1.2 V and +1.3 V is due to the saturation of the photoabsorber current going to the Cu contact before the onset of CO production. In this region, the copper current (Ix) does not increase with decreasing potential, which is expected for a semiconductor photoelectrode, causing decreased efficiency in that region. We can see this by superimposing the $\Phi_{ABPC}$ of the $I_{TZ}=0$ case (all current flows through the GaInP and GaAs components to the rear Cu (R contact)) on top of the total $\Phi_{ABPC}$ in this region. This fact will be useful when discussing the sensitivity of these cells to variations in catalyst overpotential.

For the base case (Table 1), we find that the maximum $\Phi_{ABPC}$ occurs when the partial current density for CO produced by the Au (Z contact) is half that of ethylene produced by the Cu (R contact) (all ethylene is produced by a cascade of reactions 1 and 2). At this point, the copper contact has already reached current saturation; although more negative applied potentials would increase (slightly) the CO production, it would not be converted to ethylene and maximum $\Phi_{ABPC}$ would not increase. Notably, changes in the faradaic efficiency of ethylene production by COR (reaction 2) change the value of the maximum $\Phi_{ABPC}$ but do not change the cell bias at which it occurs. If COR is assumed to have the same ethylene FE as $CO_2R$ (50%), operating in the cascade region (E<1.25 V vs RHE) is still favorable as the ethylene current still increases, despite there being no selectivity advantage (dashed line, FIG. 4A) We will see that the case of 50% FE is not advantageous compared to 2T 2J tandems in the next section.

Figure 4B:
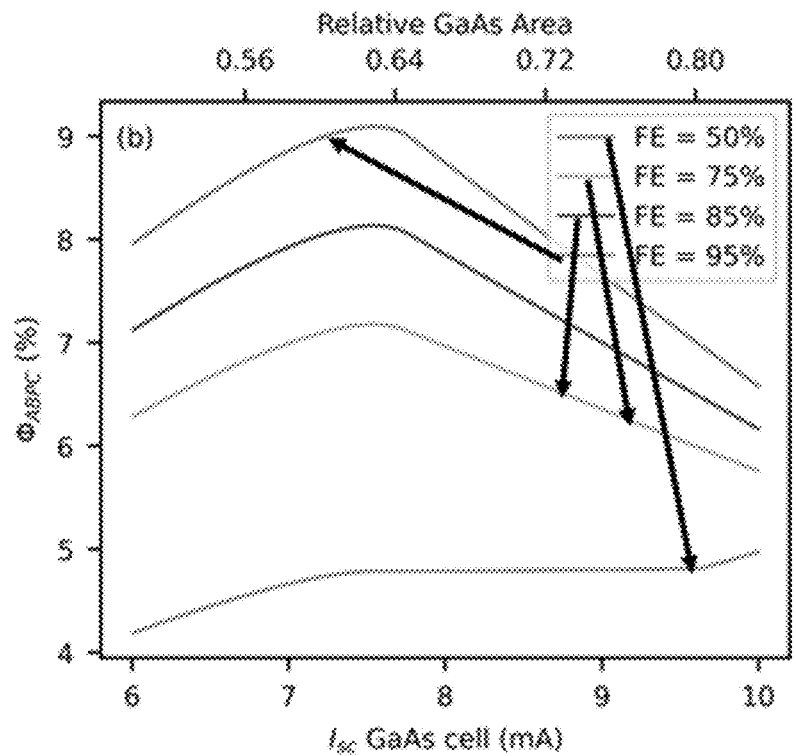
FIG. 4B shows maximum $\Phi_{ABPC}$ as a function of $I_{sc}$ of the GaAs cell (adjusted by changing area) for different faradaic efficiencies for CO conversion to ethylene (50-95%). The total limiting current for the cell was set at 12 mA as defined by the 1 $cm^2$ GaInP top cell.

The relative area of the GaAs cell, which sets $I_{sc}$, is an important design parameter. FIG. 4b shows the maximum $\Phi_{ABPC}$ as a function of the $I_{sc}$ of the GaAs cell while maintaining the $I_{sc}$ of GaInP at 12 mA (for a 1 cm² device). For the base case FE for CO conversion to ethylene (85%), the maximum $\Phi_{ABPC}$ occurs when the GaAs $I_{sc}$ is 7.56 mA, which is close to the 7.5 mA used in the base case (Table 1). This optimal value for GaAs $I_{sc}$ is unchanged for COR to ethylene FE values between 75% and 95%. However, if the FE for COR to ethylene decreases to 50%, there is not a clear maximum. As discussed below, there is no longer an energy conversion advantage of the 3TT compared to the 2T 2J in this case.

Comparison of 2T and 3TT Geometries

Figure 5A:
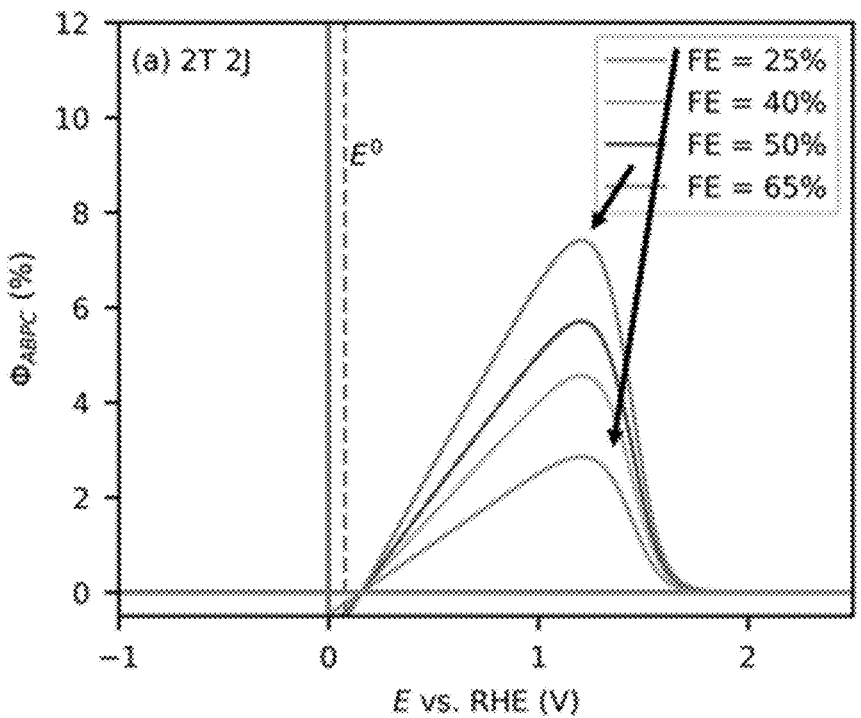
FIG. 5A shows $\Phi_{ABPC}$ vs E for the 2T 2J device at varying faradaic efficiencies for $CO_2$ to ethylene.
Figure 5B:
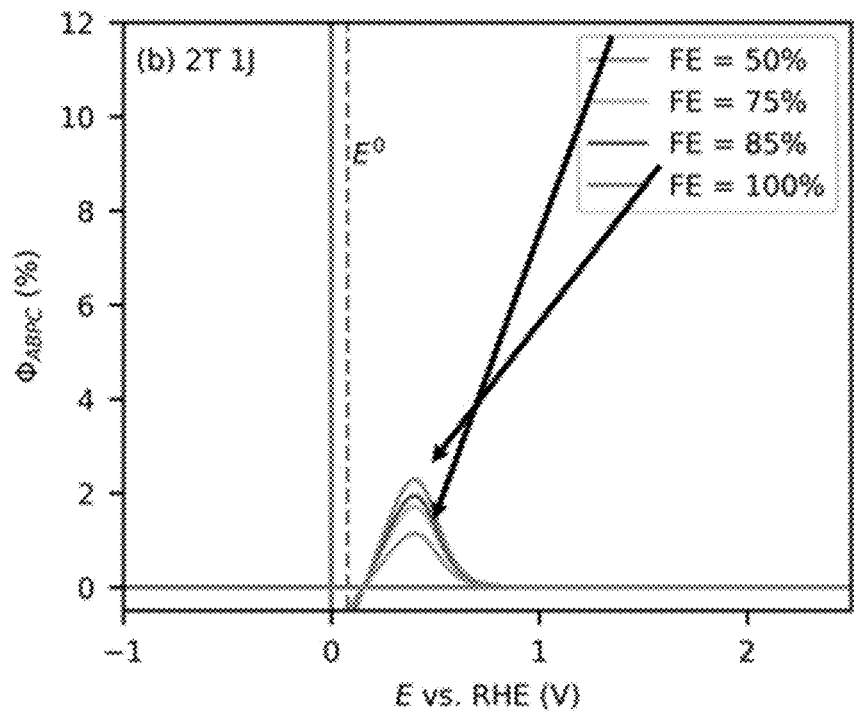
FIG. 5B shows $\Phi_{ABPC}$ vs E for the 2T 1J device at varying faradaic efficiencies.

The $\Phi_{ABPC}$ metric is useful to compare the 3TT to the 2T configurations. $\Phi_{ABPC}$ as a function of bias at different faradaic efficiencies for COR to ethylene for the 2T 2J and 2T 1J cases are shown in FIGS. 5a and b. Using the base case values (Table 1), the maximum $\Phi_{ABPC}$ values are 5.9% and 1.1% for the 2T 2J and 2T 1J cases, respectively, which are lower than the 8.3% value for the 3TT case. Thus, the use of 3TT-mediated cascade pathway makes the overall conversion of $CO_2$ to ethylene via more energy efficient compared to similar two terminal devices under the base case assumptions (Table 1).

This analysis allows determination of conditions for which a 3TT design will be more efficient than other geometries. Comparing to a single absorber geometry is quite simple. Even assuming 100% faradaic efficiency for the direct conversion of $CO_2$ to ethylene, the GaInP single absorber configuration has a maximum $\Phi_{APBC}$ of 2.3%, which is lower than that of the 3TT configuration. This is because the 3TT's cascade operating point is at higher potentials compared to the potential at max $\Phi_{APBC}$ due to the lower overpotential of CO production compared to direct $CO_2$ reduction.

Comparison to the 2T 2J case is more nuanced. Although the maximum $\Phi_{APBC}$ for the 2T 2J case occurs at higher potentials, they also suffer from the low faradaic efficiencies and higher overpotentials of $CO_2R$ on Cu, which means their performance compared to 3TTs will be very sensitive to the catalyst performance. The 3TT mediated cascade mechanism needs to be more Faradaically efficient than the 2T 2J mediated direct conversion to be equally or more efficient. In base case, the FE for cascade conversion (3TT mediated) would need to be 60% to be equally efficient with direct conversion (2T 2J mediated) which has 50% FE. Such increases in selectivity for CO reduction is quite small and has been shown before, allowing the 3TT to be more efficient under these assumptions.

Response to Varying Cu $CO_2R$ Overpotential

Figure 6A:
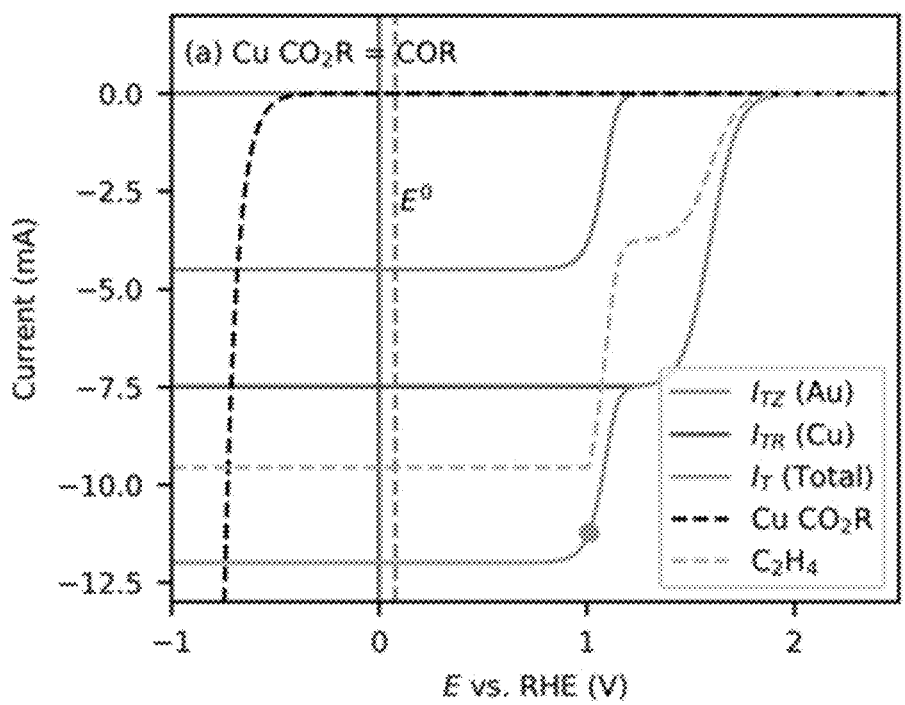
FIG. 6A illustrates I-V behavior for 3TT device in the case where COR and $CO_2R$ onset potentials are both −0.45 V vs RHE (all other parameters are the same as Table 1).
Figure 6B:
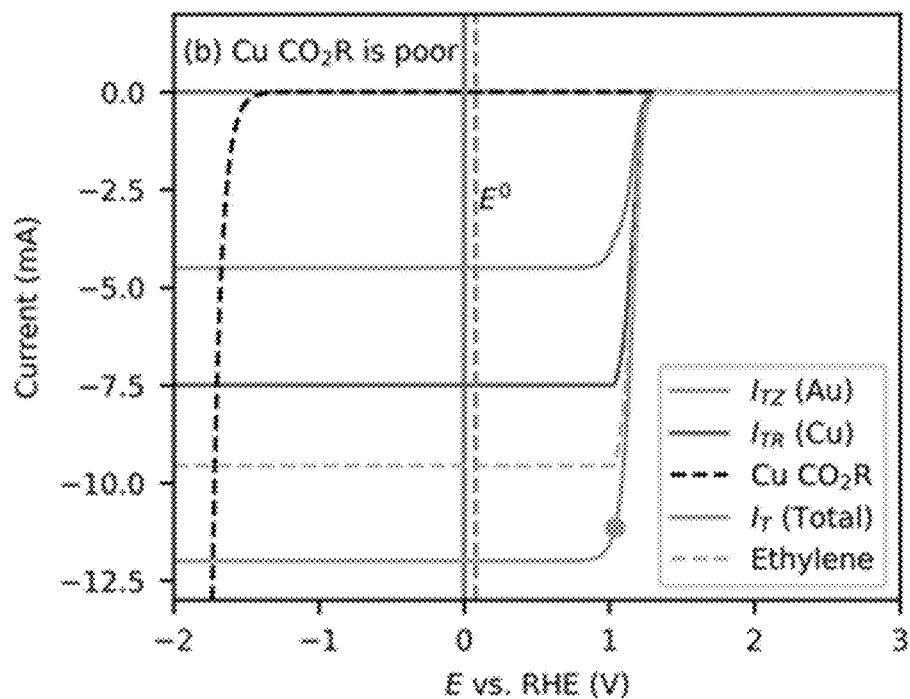
FIG. 6B illustrates I-V behavior for 3TT device in the case where $CO_2R$ onset is much lower than COR.

In our analysis above, we examined the case when the $CO_2R$ onset (−0.65 V vs RHE) is more negative than that for COR (−0.45 V vs RHE). However, the range of experimentally reported overpotentials for $CO_2R$ is quite large, motivating us to consider how 3TT tandem PEC cells can be designed for different values of this parameter. To this end, we will consider two limiting cases: one where $CO_2R$ and COR have the same (modest) onset and one where the $CO_2R$ overpotential is very large (resulting in Cu onset more negative than Au onset), anticipating that intermediate cases will lie between these two extremes. FIG. 6A shows the I-V behavior of 3TT PEC cell configuration shown in FIG. 1A, but with the dark $CO_2R$ onset and COR onset both at −0.45 V. FIG. 6B shows the I-V behavior in identical conditions except with dark COR onset at −0.45 V and dark $CO_2R$ onset at −1.5 V.

Figure 16:
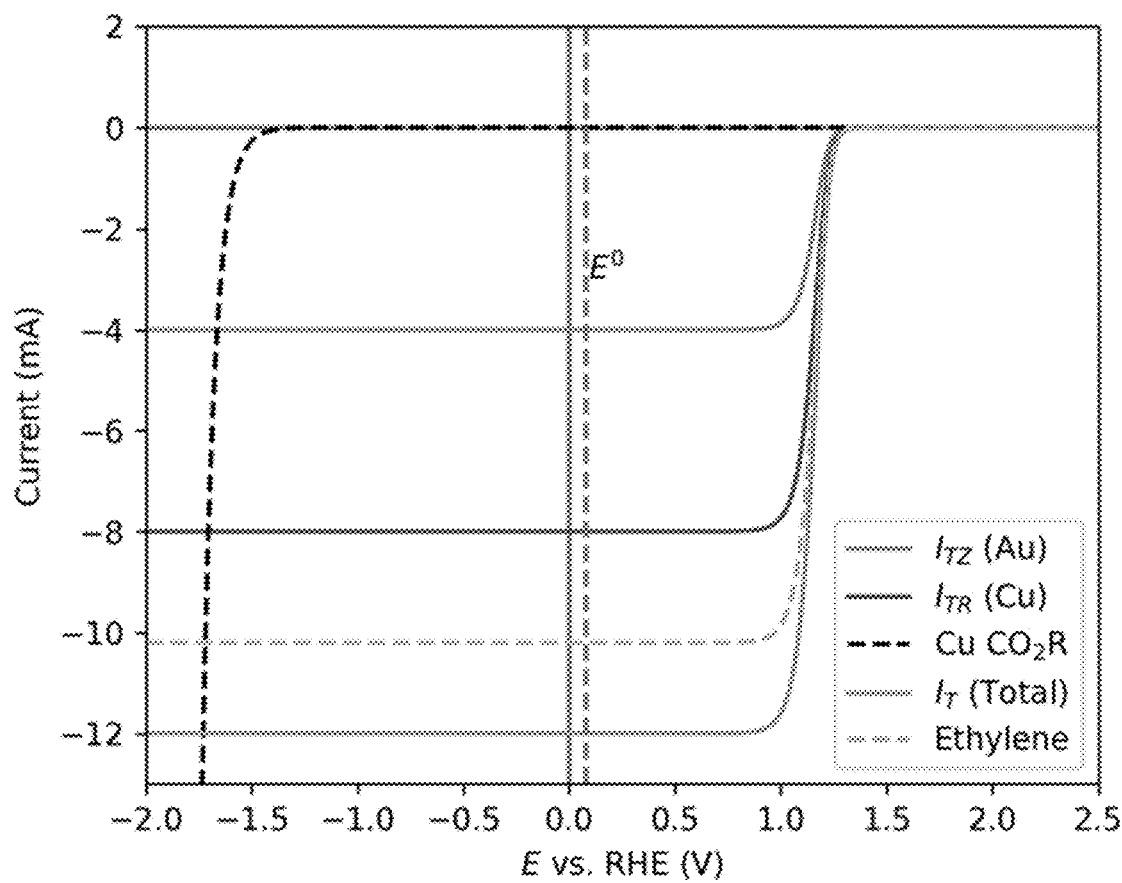
FIG. 16 illustrates J-V behavior for a cell where overpotential of $CO_2R$ is far higher than COR, and the area of the GaAs cell causes its short circuit current to exceed 8 mA. Here we set it 10 mA.
Figure 17:
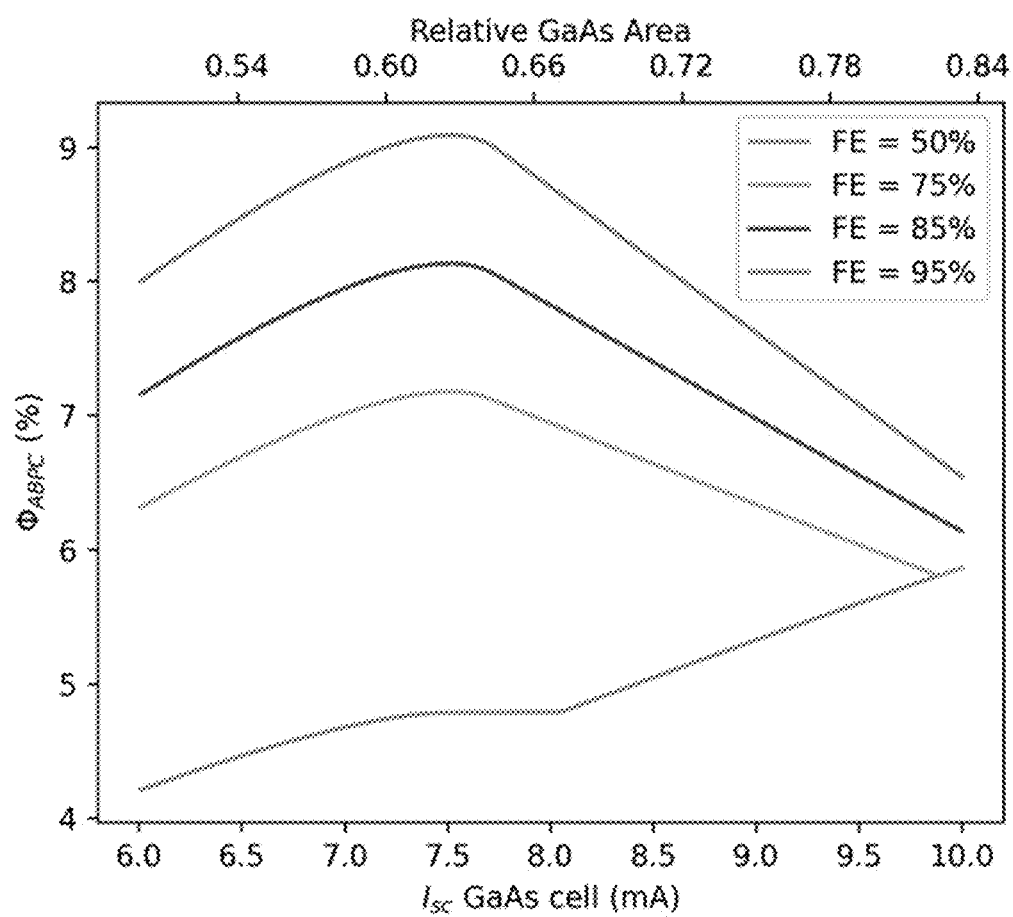
FIG. 17 shows maximum $\Phi_{ABPC}$ as a function of $I_{sc}$ of the GaAs cell at different faradaic efficiencies, when the activity of $CO_2R$ is the same as COR in Table 1. The total limiting current for the cell was maintained at 12 mA as defined by the 1 $cm^{-2}$ GaInP top cell.

In FIG. 6A, we see that the I-V behavior is similar, overall, to the base case (Table 1). The only difference is that the copper catalyst (R contact) saturates at higher applied bias prior to cascade onset, which allows for greater efficiency outside the cascade region (E>1.25 V vs RHE). FIG. 6b depicts an extreme case of CO-limited ethylene production due to the very large overpotential for the direct $CO_2$ conversion pathway on Cu. Thus, in this case, CO production from the Au catalyst and ethylene production from the Cu catalyst begin at the same applied bias, +1.25 V vs RHE. In principle, a direct $CO_2$ to ethylene pathway would be possible at +0.9 V vs RHE but the light-limited current density has already been reached by this point. As the result, there are no conditions of applied bias for which direct $CO_2$ conversion to ethylene via reaction (3) occurs. Another interesting property arises in these conditions as direct conversion is effectively suppressed. If the $I_{sc}$ for the GaAs cell is increased above 8 mA (by increasing its area), the GaAs subcell would not saturate at that $I_{sc}$ as the CO current would be limiting. The system would instead saturate at 4 mA to the Au (Z) contact and 8 mA to the Cu (R) contact, maintaining a consistent 1:2 ratio of currents such that the Cu is supplied with enough CO to reduce (see FIG. 16).

Figure 13A:
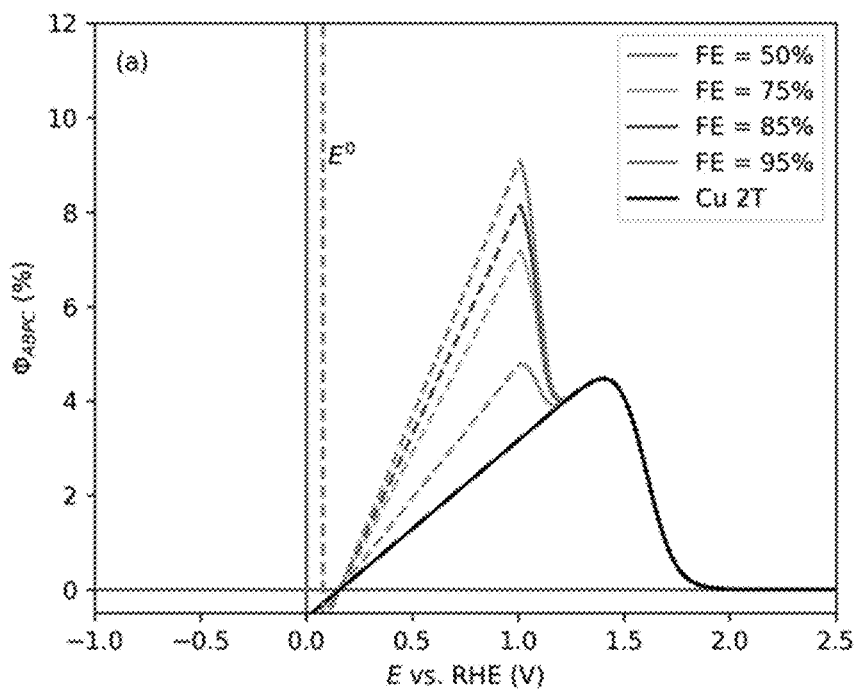
FIG. 13A shows $\Phi_{ABPC}$ vs E for the 3TT device when COR and $CO_2R$ have the same activity. Using baseline onset of (−0.45 V) as shown in Table 1 in the main text.
Figure 13B:
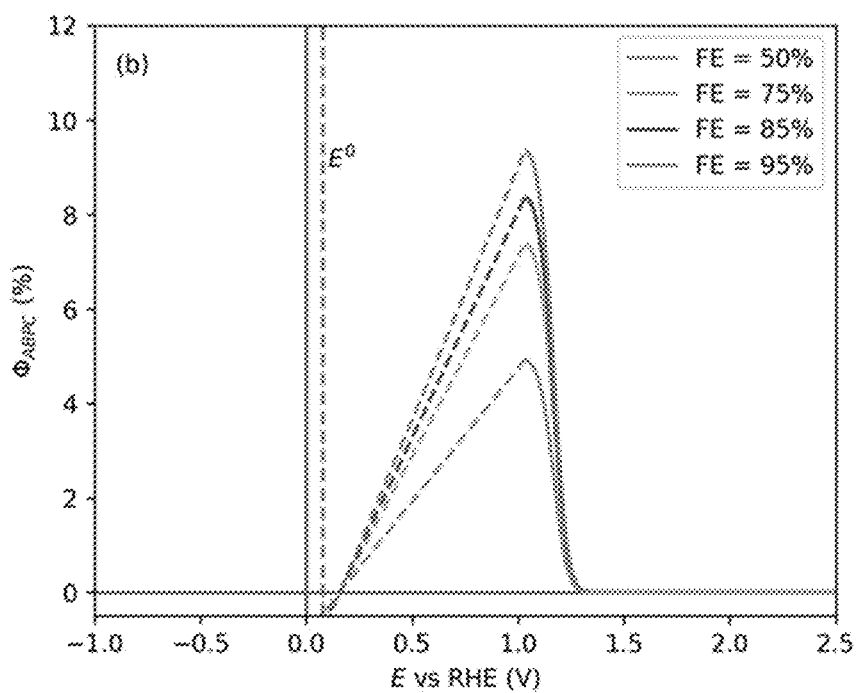
FIG. 13B shows $\Phi_{ABPC}$ vs E for the 3TT device when the activity for $CO_2R$ is far lower than COR. J-V curves for these two systems are in the main text.
Figure 14A:
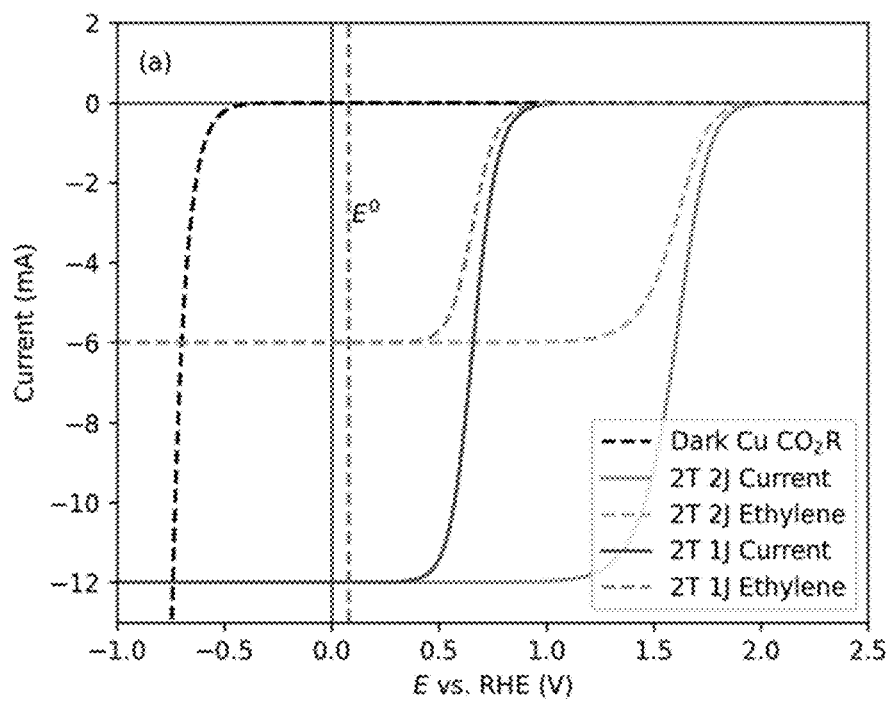
FIG. 14A provides a J-V curve for the two terminal two junction (2T 2J) and two terminal one junction (2T 1J) devices when the activity for $CO_2R$ is the same as COR (onset of −0.45 V) as shown in Table 1 in the main text.
Figure 14B:
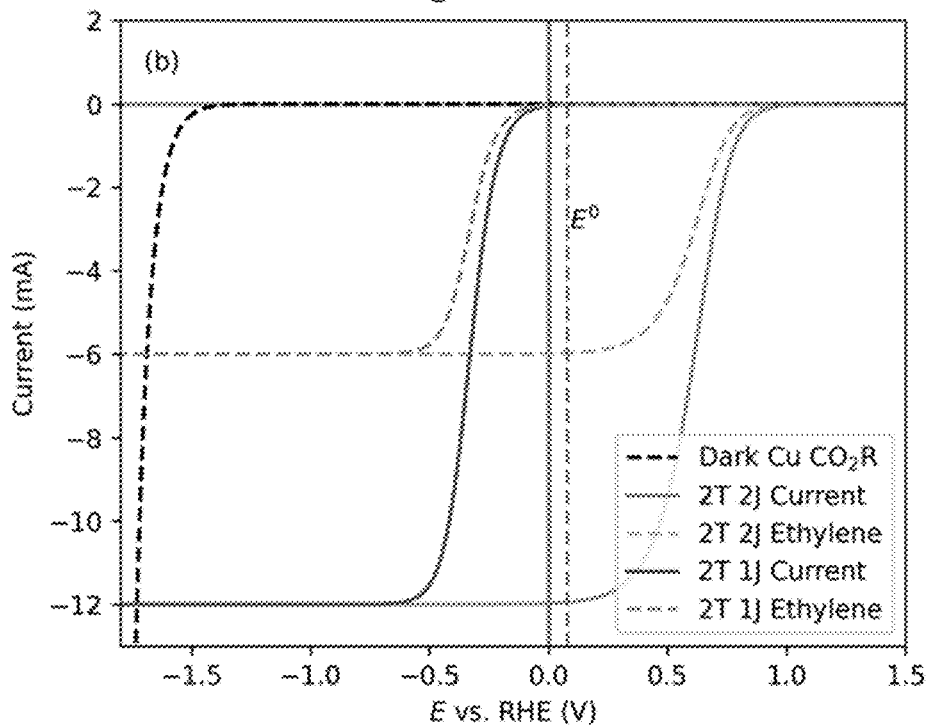
FIG. 14B shows a J-V curve for 2T 2J and 2T 1J devices when the activity for $CO_2R$ is far less than for COR.
Figure 15A:
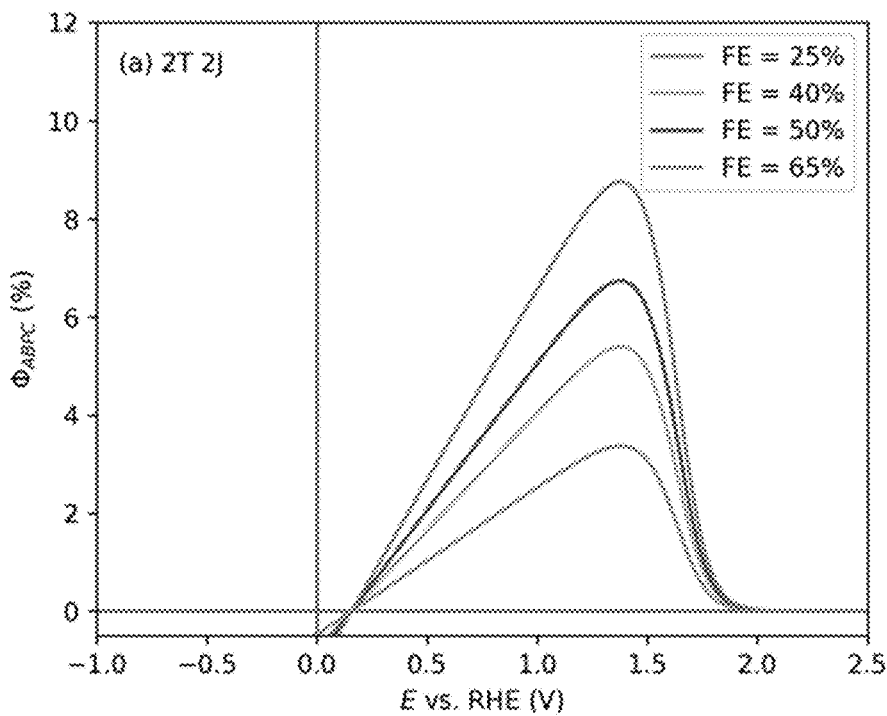
FIG. 15A shows $\Phi_{ABPC}$ vs E for the 2T 2J device when the activity for $CO_2R$ is the same as COR, with parameters shown in Table 1.
Figure 15B:
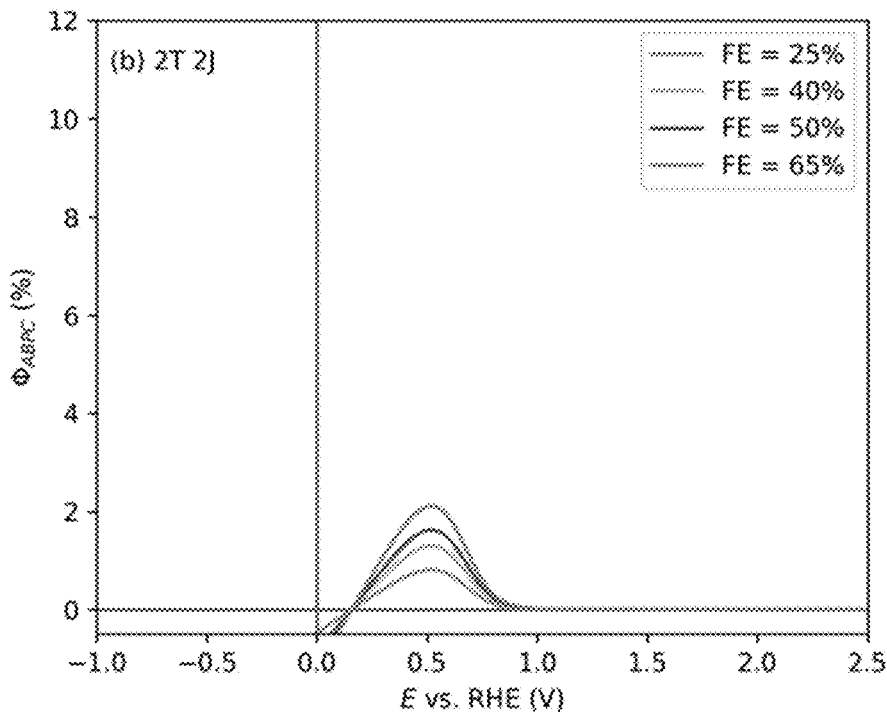
FIG. 15B shows $\Phi_{ABPC}$ vs E for the 2T 2J device when the activity for $CO_2R$ is far lower than COR, dark curve shown in FIG. 14B.
Figure 15C:
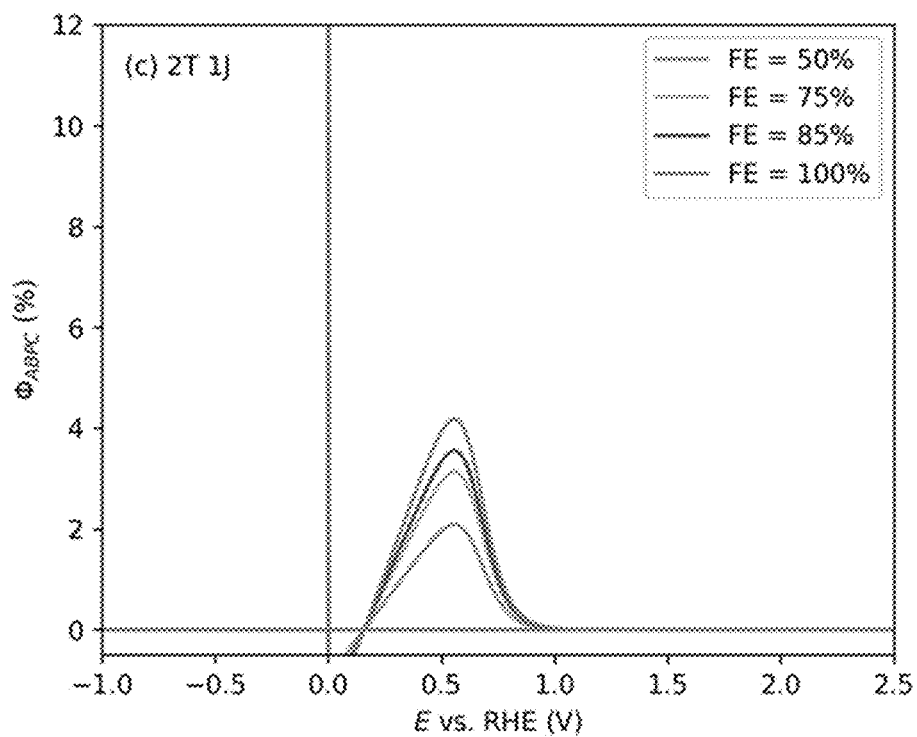
FIG. 15C shows $\Phi_{ABPC}$ vs E for the 2T 1J device when the activity for $CO_2R$ is the same as COR, with parameters shown in Table 1.
Figure 15D:
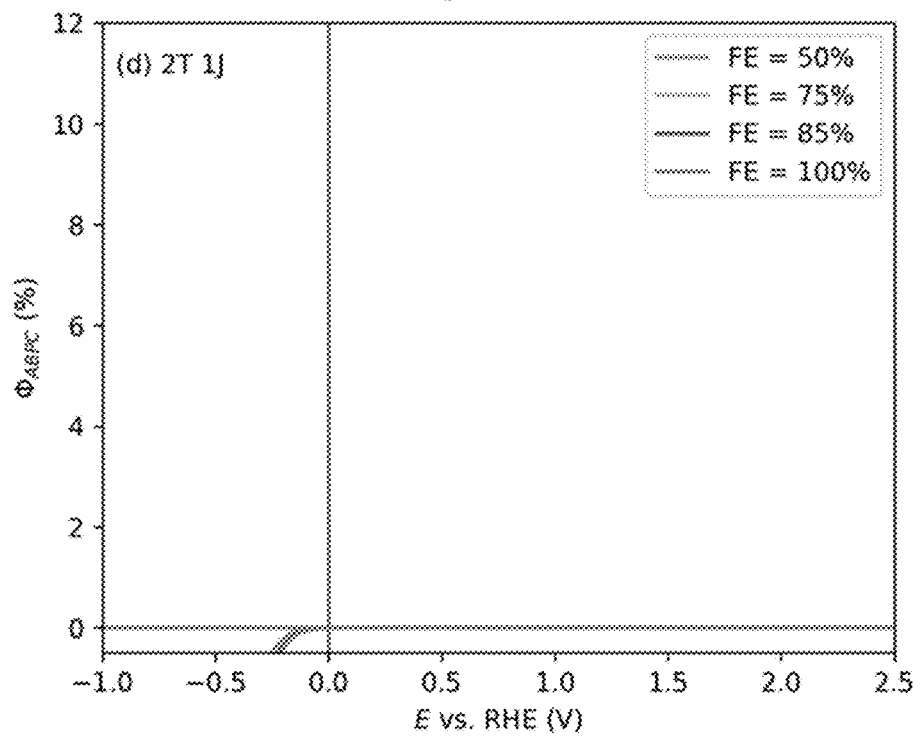
FIG. 15D $\Phi_{ABPC}$ vs E for the 2T 1J device when the activity for $CO_2R$ is far lower than COR, dark curve shown in FIG. 14B.

The I-V curves for 2T 2J and 2T 1J devices and $\Phi_{ABPC}$ vs E curves are shown in FIGS. 13-15 for these limiting cases. Interestingly, the maximum $\Phi_{ABPC}$ for the 3TT configuration is similar (ca. 8%) for both of the limiting cases. This shows that a 3TT device can be insensitive to changes in $CO_2R$ activity; further discussion of this phenomenon follows. As expected, the $\Phi_{ABPC}$ for a two-terminal cell (2T 1J and 2T 2J) cell depends on the assumed overpotential for direct $CO_2$ conversion to ethylene via reaction 3, as a cascade pathway is not possible (FIG. 15).

Sensitivity to Changes in Catalyst Activity

Figure 7:
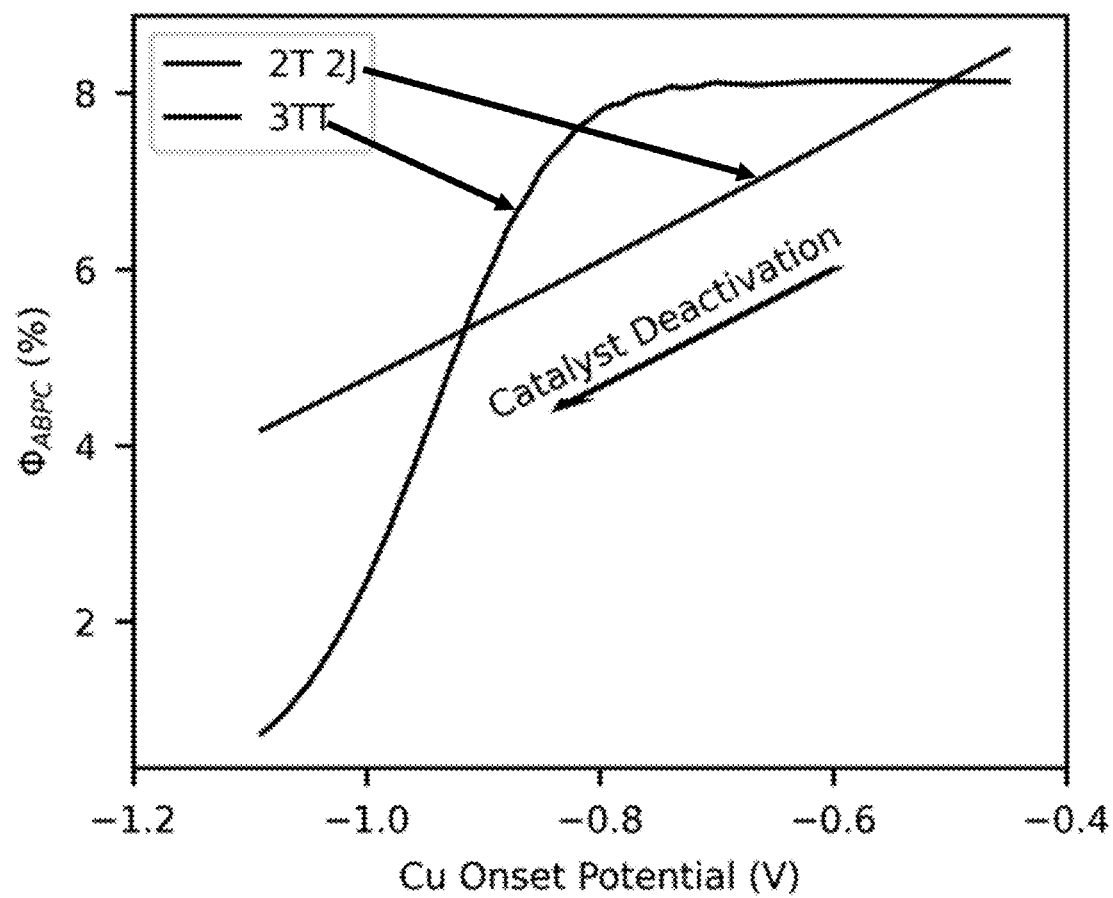
FIG. 7 provides $\Phi_{ABPC}$ vs the Cu onset potential for dark COR and $CO_2R$ (with Au onset potential held constant). Faradaic efficiencies were adjusted so curves intersect at two points for illustrative purposes (85% for cascade conversion via reactions 1 and 2 and 63% for direct conversion via reaction 3).

There are significant differences in how 2T 2J and 3TT designs respond to changes in catalyst activity. We consider here the response to an increase in the overpotential for reactions 2 and 3 over time, a phenomenon which is frequently observed experimentally. FIG. 7 shows $\Phi_{ABPC}$ for ethylene production as a function of the dark Cu overpotential (for both $CO_2R$ and COR), while holding the onset potential of $CO_2R$ to CO on constant. Faradaic efficiencies were chosen (85% for COR and 63% for $CO_2R$) such that the two cell designs had the same $\Phi_{ABPC}$ for a COR/$CO_2R$ onset potential of −0.5 V vs. RHE. For a large range of Cu overpotentials, up to about −0.8 V vs RHE, the position of maximum $\Phi_{ABPC}$ for the 3TT device occurs when the Cu catalyst is current limited. As a result, the $\Phi_{ABPC}$ for a 3TT device is insensitive to the Cu overpotential over a wide operating range. In contrast, the $\Phi_{ABPC}$ for the 2T 2J design decreases with increasing overpotential (more negative onset potentials), as expected. However, there is a limit to the operating range where the 3TT device outperforms the 2T 2J device. If the Cu overpotential becomes too large, the current tuning requirement for cascade conversion cannot be met and the $\Phi_{ABPC}$ for the 3TT device rapidly decreases. In FIG. 7, this occurs for onset potentials more negative than −0.85 V vs RHE.

Design Principles of 3TT PEC Devices

The concept of tandem cascade PEC can be generalized beyond the specific case discussed so far. When designing 3TTs for PEC systems, it is important to choose reactions that can be advantageously done in a cascade with efficient transport of the intermediate species. In the case considered above, the goals were to control selectivity and optimize energy conversion efficiencies, but there could be other motivations, some of which are discussed below.

For each electrochemical step in a cascade, the number of electrons required, and their relative standard reduction potential are crucial design parameters as they determine how to couple the electrocatalysts to the PV subcells in order to properly match the photocurrents to the reaction chemistry. A general two-step cascade would have m electrons transferred in the first step and n electrons in the second step (m/n was 4/8 for ethylene production through CO):

$$A + me^- \pm xH^+ \rightarrow B + yH_2O, E^0 = p \quad (5)$$

$$B + ne^- \pm zH^+ \rightarrow C + wH_2O, E^0 = q \quad (6)$$

As an illustrative example on how to design for different reaction chemistries, we will consider a two-step cascade of $CO_2$ to formaldehyde, then to methanol, with the reduction half reactions and $E^0$ values shown in equations 7 and 8. This differs from our ethylene case as the difference in the $E^0$ values is larger and the electron ratio m/n is 4/2.

$$CO_2 + 4e^- + 4H^+ \rightarrow H_2C_0 + H_2O, E^0 = -0.123V \text{ vs RRE} \quad (7)$$

$$H_2CO + 2e^- + 2H^+ \rightarrow CH_3OH, E^0 = 0.294V \text{ vs RRE} \quad (8)$$

One could imagine performing these reactions selectively with enzyme or enzyme-like catalysts, such that the faradaic efficiencies are ~100% and the direct 6-electron conversion is not possible. There are experimental reports which suggest that such a system may be possible: other groups have reported on three step enzyme-mediated conversion of $CO_2$ to methanol using a micelle microenvironment and have shown that formate dehydrogenase anchored to pyrolytic graphite can reversibly and selectively oxidize/reduce formate/$CO_2$ at very low overpotentials.

Figure 8A:
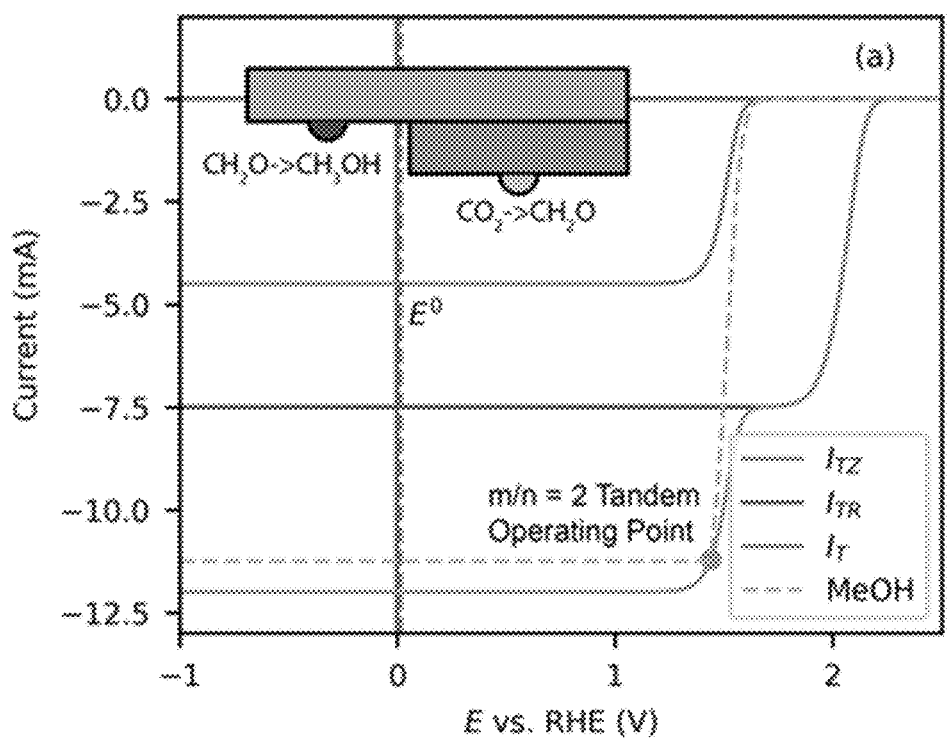
FIGS. 8A-8B provides I-V behavior of a 3TT cell using enzymes as catalysts.
Figure 8B:
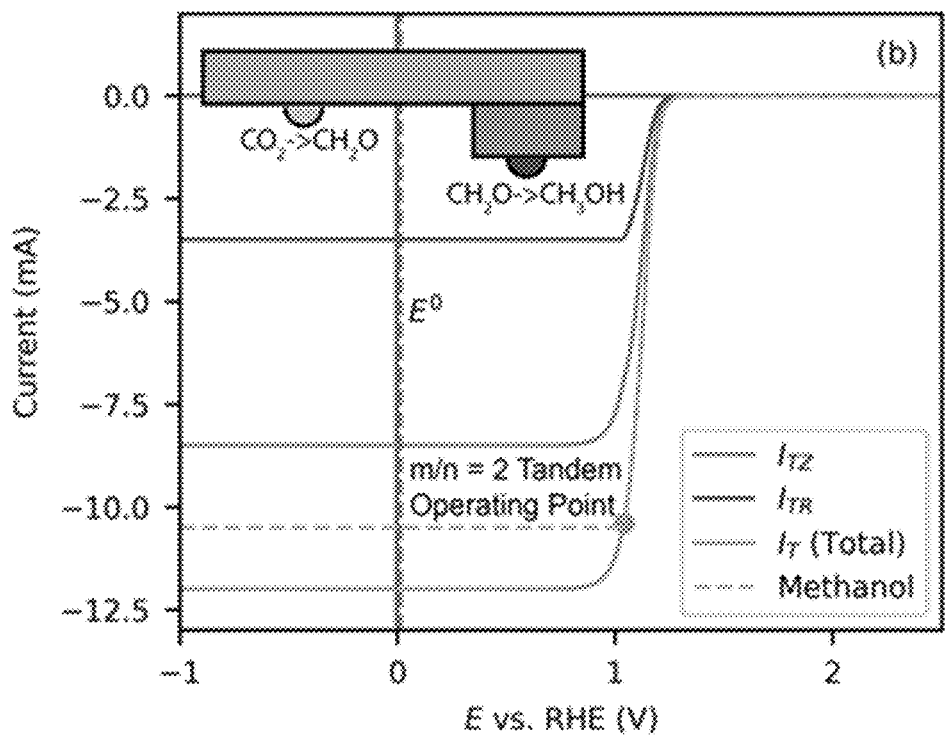
Figure 18:
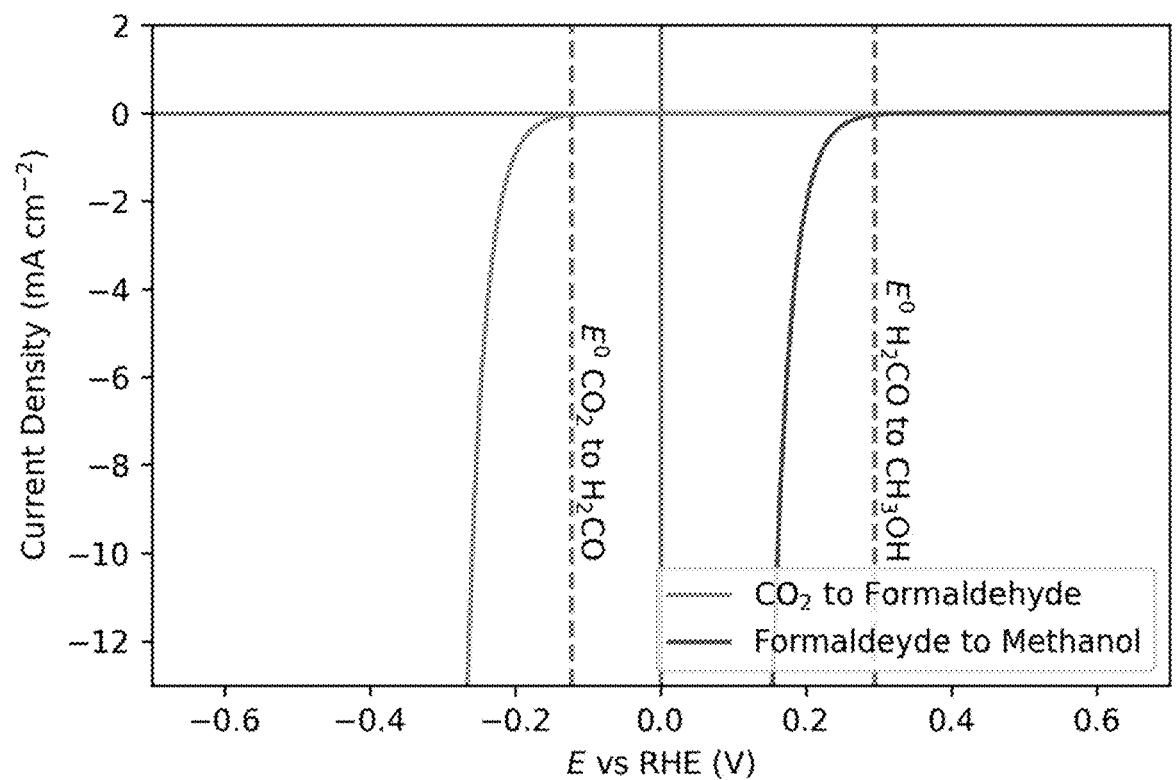
FIG. 18 provides dark models used for the enzyme catalysts. Modeled to have low overpotential compared to their respective $E^0$s.
Figure 19:
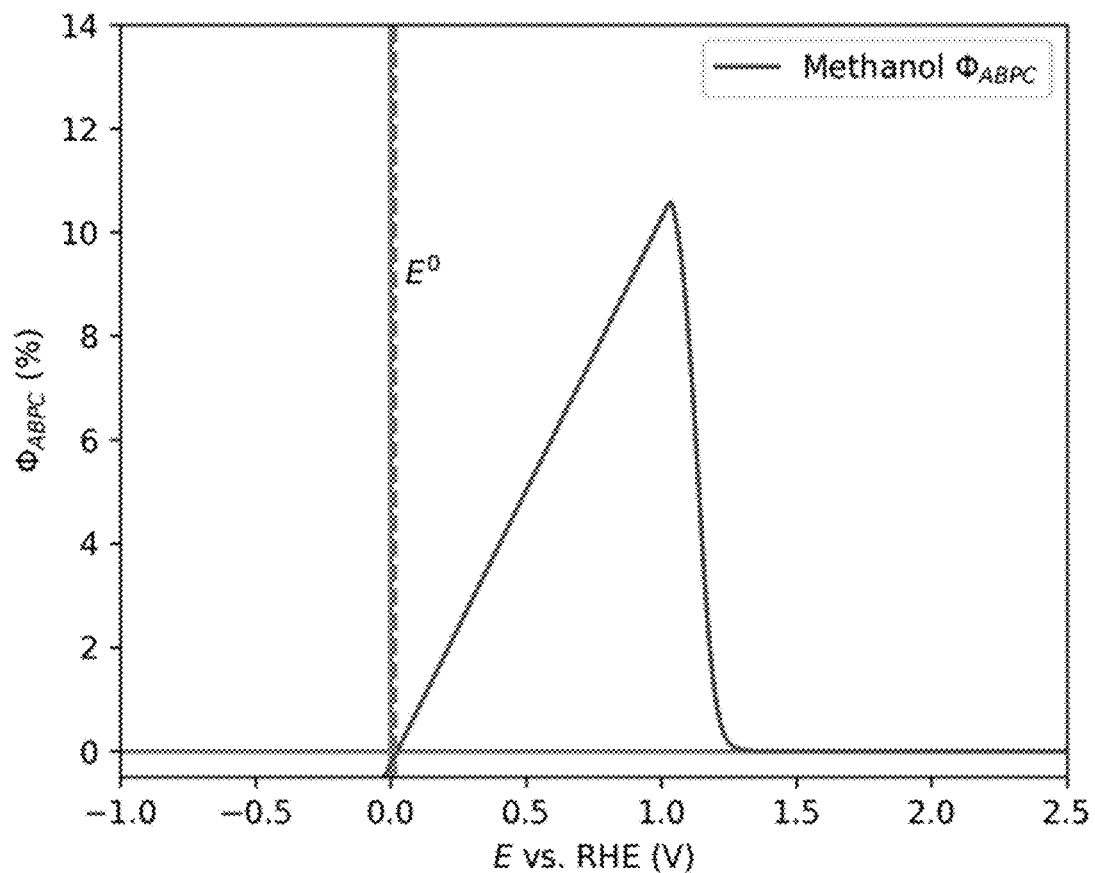
FIG. 19 shows $\Phi_{ABPC}$ vs E for the 3TT enzyme system to methanol, with the parameters of the simulation shown in Table 3.
Figure 20:
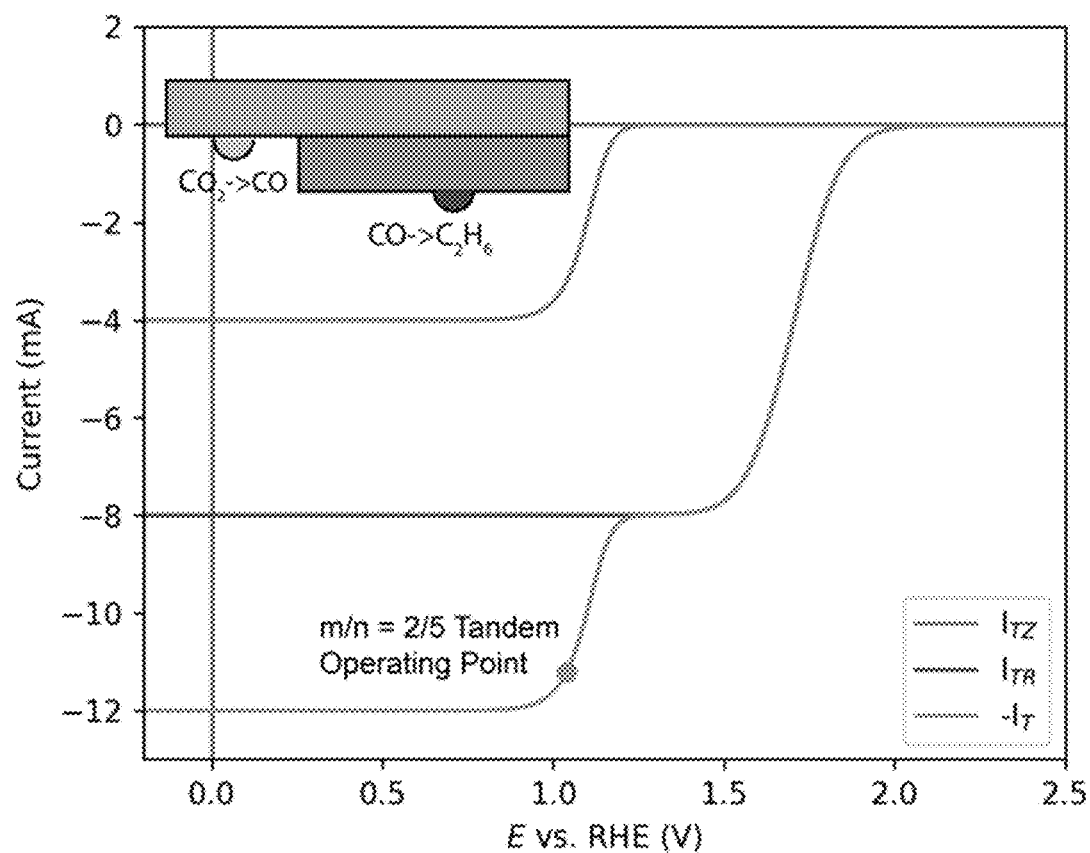
FIG. 20 shows $\Phi_{ABPC}$ vs E for the 3TT enzyme system to methanol, with the parameters of the simulation shown in Table 4.

We will assume similar low overpotentials such as those reported by prior research for our kinetic models; the I-V curves for the catalysts in the dark are shown in FIG. 18. Because each contact has a different photovoltage it is important to consider where to place each catalyst. In this enzyme example, when the formaldehyde-producing catalyst is coupled to the GaAs (FIG. 8A), there is current at high values of applied potential but no cascade conversion to methanol (this process turns on at applied potentials below +1.6 V vs RHE). In contrast, when the formaldehyde-producing catalyst is coupled to the GaInP sub cell, the methanol enzyme is limited by the formaldehyde current so there is no current for potentials above +1.25 V vs RHE (FIG. 8B). Additional parameters for the simulations in FIG. 8 are in Tables 3 and 4; $\Phi_{ABPC}$ vs E for each simulation are shown in FIG. 19 and FIG. 20.

TABLE 3

Summary of parameters and properties used to simulate the 3TT enzyme cell in FIG. 8A.

| (Sub)Cell | $J_{sc}$ (mA cm$^{-2}$) | $V_{oc}$ (V) | FE (%) | Dark Onset (V) |
|---|---|---|---|---|
| GaInP/Au | 12 | 1.4 | CH$_3$OH: 100 | 0.25 |
| GaAs/Cu | 7.5 | 1.0 | H$_2$CO: 100 | −0.15 |

TABLE 4

Summary of parameters used to simulate the 3TT enzyme cell in FIG. 8B.

| (Sub)Cell | $J_{sc}$ (mA cm$^{-2}$) | $V_{oc}$ (V) | FE (%) | Dark Onset (V) |
|---|---|---|---|---|
| GaInP/Au | 12 | 1.4 | H$_2$CO: 100 | −0.15 |
| GaAs/Cu | 3.5 | 1.0 | CH$_3$OH: 100 | 0.25 |

The cascade operating point is 0.4 V more positive in FIG. 8A than in FIG. 8B, making the configuration in FIG. 8A more efficient than FIG. 8B. As such, when designing 3TT PEC cells, it is generally favorable to couple the catalyst driving the greater (more positive or less negative) $E^0$/onset to the wider bandgap cell, and the catalyst driving the lower (more negative, or less positive) $E^0$/onset to the smaller bandgap cell. This maximizes the potential of the cascade operating point relative to $E^0$ for the full reaction as the wider bandgap subcell determines this value. Coupling catalysts in this manner takes full advantage of the extra voltage from the tandem solar cells. This principle also explains why the Cu cell was coupled to the GaAs absorber in the ethylene production base case (FIG. 1A, Table 3) as the onset of $CO_2R$/COR to ethylene was assumed to be more negative compared to CO generation.

Figure 21:
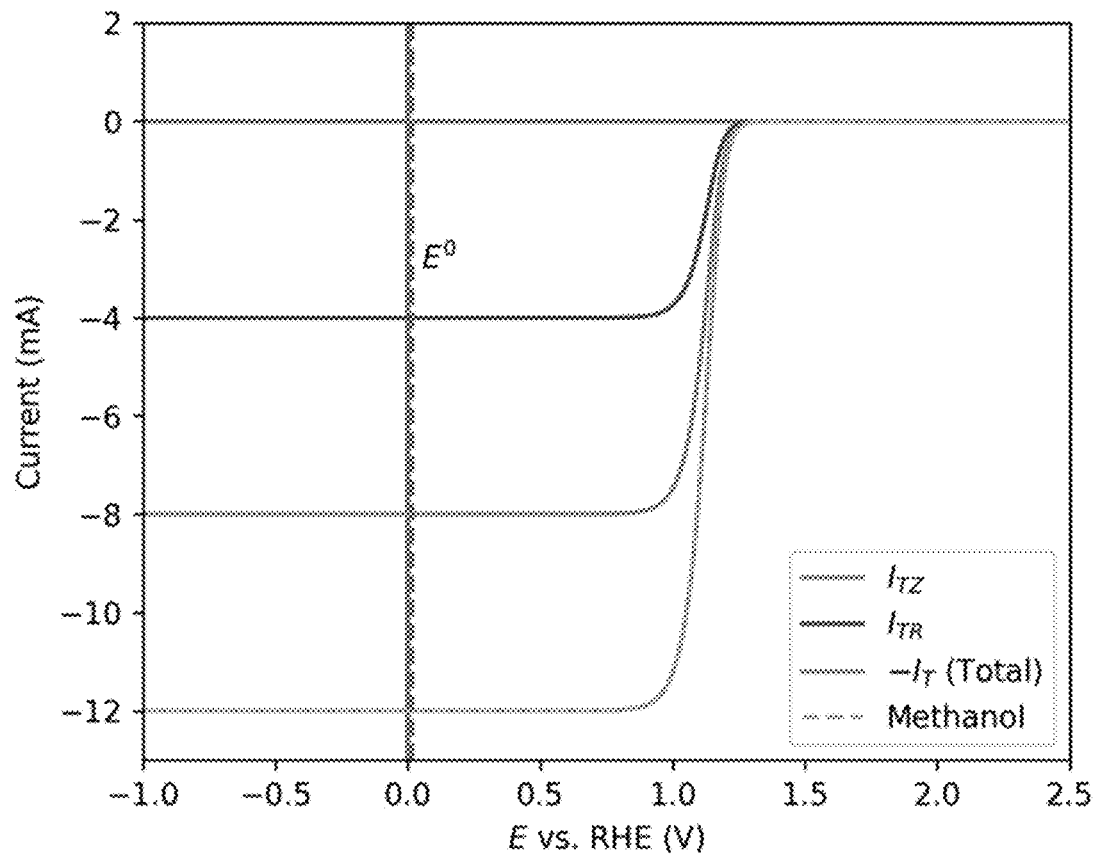
FIG. 21 shows a J-V curve for a system driving $CO_2$ to CO and then to ethane. The inset shows how the relative area of the GaAs needs to increase to accommodate a reaction where m/n=2/5. Parameters of simulation were assuming the same CO dark current (FIG. 10), and that $CO_2R$ and COR had the same dark onset of −0.45 V.
Figure 22:
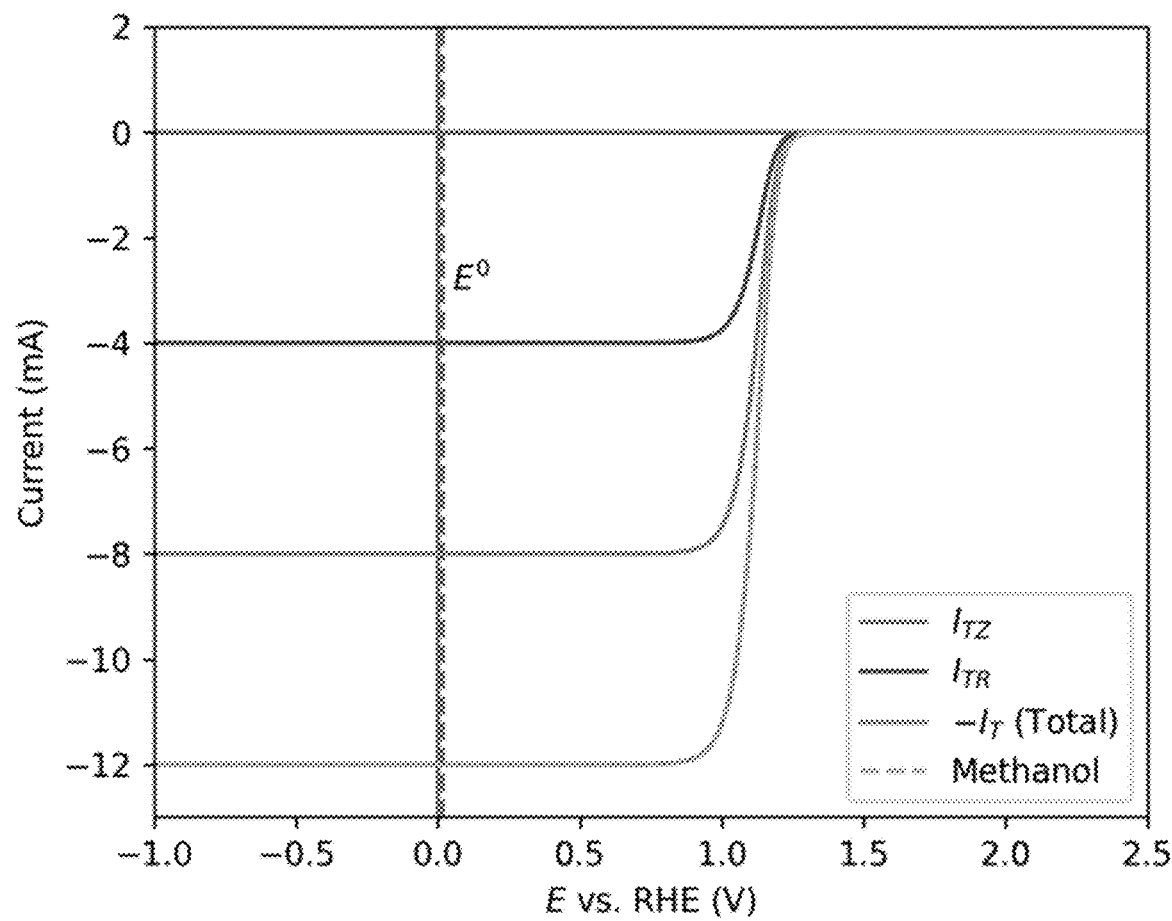
FIG. 22 shows a: J-V curve of the enzyme system where the formaldehyde catalyst was coupled to the GaInP cell and the GaAs cell had an $I_{sc2}$ greater than 4 mA. Just like the case examined where $CO_2R$ was effectively suppressed in the tandem and the ethylene production was limited by the intermediate current, if the area of the GaAs cell was made too large, there wouldn't be enough formaldehyde intermediate for the second enzyme to reduce, hence the limiting currents for the subcells would be 8 mA and 4 mA respectively (the expression $I_{sc1}-I_{sc2}$ going to the first cathode does not apply in this case).

In the insets in FIG. 8A and FIG. 8B, the relative areas between the two absorbers are also different for each case. In FIG. 8A, a larger GaAs cell is needed to increase $I_{sc2}$ for efficient operation, as it drives a process requiring more electrons. However, in FIG. 8B, the GaAs cell area must be smaller to decrease $I_{sc2}$, as it drives a process requiring fewer electrons compared to the other cell. Tuning the current in this manner optimizes the conversion efficiency toward the desired product and highlights the importance in considering the electron stoichiometry when designing 3TT PEC devices. We consider another case of two-step conversion of $CO_2$ to ethane via a CO intermediate in FIG. 21; in this case m/n=2/5.

The cascade operating points for all the cases are shown as dots. Following from the discussion above, the cascade operating point maximizes selectivity to the product of the cascade reaction, and for the parameters we have chosen, is also the point of maximum conversion efficiency. Thus, for optimal operation, a system similar to a MPP tracker used in solar cells should be used to maintain operation at the cascade operating point (or point of maximum efficiency during times when no cascade operating point exists) in response to changes in the spectrum and intensity of the incident light.

Additional Embodiments

Additional embodiments of tandem PECs include: (1) coupling devices together to drive larger chemical network with more electron transfer processes (2) use of the time domain.

To this point, we have considered designs at the cell level; by analogy to coupling PV cells together to form a module, one can consider coupling together different type of cascade PEC devices to drive more complex systems, with cells coupled to different catalysts. One example would be the synthesis of water insoluble products such as hexane or octane. It may be possible to couple electrochemical and thermal conversion steps and/or perform the conversion in a sequence of reactors, as suggested by the tandem electrochemical conversion.

3TT PEC devices could also be used to affect sequential photocatalysis and perform other time-controlled experiments. One way to do this is using LED mixing, as this allows for optical tuning of the currents. For example, if certain reactions require a higher intermediate concentration before the reaction can proceed, we could maintain a constant blue light to build up intermediate produced at the Z contact and then turn on red light once sufficient intermediate is present. One could also adjust the bias for temporal control of the currents. For example, we could operate at higher potential in the beginning forcing all current through the R contact, then operate at lower bias, turning on the catalyst at the Z contact. The fact that the catalytic sites are spatially separated and, potentially, digitally controllable, could be used to probe transport kinetics or be used for more careful control of selectivity.

CONCLUSION

In summary, we have outlined some of the design principles for three-terminal tandem photoelectrochemical devices by examining the current tuning requirements for different reaction mechanisms and discussing the systems where using a cascade mechanism would be favorable. We showed that using a three-terminal tandem photoelectrochemical device to drive a tandem cascade reaction is more efficient than a two-terminal single junction device, and depending on the parameters, more efficient than two-terminal, two-junction devices, for the example case of $CO_2R$ through a CO intermediate. We examined the devices' response to variations in catalyst activity for COR and $CO_2R$ and showed that three-terminal devices can be less sensitive to variations in catalyst activity compared to the two terminal devices. We also discussed the use of three-terminal tandems for modulated and time-controlled experiments that could be used for more complex tandem cascade reaction mechanisms and probing reaction kinetics for light driven $CO_2$ reduction.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

As used herein and in the appended claims, the singular forms "a", "an", and "the" include plural reference unless the context clearly dictates otherwise. Thus, for example, reference to "a cell" includes a plurality of such cells and equivalents thereof known to those skilled in the art. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

When a group of substituents is disclosed herein, it is understood that all individual members of that group and all subgroups, are disclosed separately. When a Markush group or other grouping is used herein, all individual members of the group and all combinations and subcombinations possible of the group are intended to be individually included in the disclosure. For example, when a device is set forth disclosing a range of materials, device components, and/or device configurations, the description is intended to include specific reference of each combination and/or variation corresponding to the disclosed range.

Every formulation or combination of components described or exemplified herein can be used to practice the invention, unless otherwise stated.

Whenever a range is given in the specification, for example, a density range, a number range, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter is claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A device comprising:
    a photovoltaic device capable of generating current at a plurality of potentials;
    a first catalyst in electronic communication with the photovoltaic device; and
    a second catalyst in electronic communication with the photovoltaic device;
    wherein the photovoltaic device comprises a photoelectrode and a transparent conductive encapsulant (TCE) layer which further comprises a polymer, a plurality of microspheres of the first catalyst and a plurality of microspheres of the second catalyst.

2. The device of claim 1, wherein the photovoltaic device is a multijunction stacked semiconductor device.

3. The device of claim 2, wherein the photovoltaic device is a three-terminal tandem (3TT) semiconductor device.

4. The device of claim 1, wherein the photovoltaic device comprises a plurality of photovoltaic devices positioned on a substrate.

5. The device of claim 1, wherein the photovoltaic device comprises a doped interdigitated back contact semiconductor device and the first catalyst is in communication with a first doped region and the second catalyst is in communication with a second doped region.

6. The device of claim 1, wherein the photovoltaic device comprises a semiconductor.

7. The device of claim 6, wherein the semiconductor is selected from the group consisting of: InGaP, GaAs, $In_xGa_{1-x}N$, perovskite and silicon.

8. The device of claim 1, wherein the first catalyst comprises silver (Ag) or gold (Au).

9. The device of claim 1, wherein the second catalyst comprises copper (Cu).

10. The device of claim 1, wherein the first catalyst is configured to catalyze a first reaction when receiving current at a first potential from the photovoltaic device and the second catalyst is configured to catalyze a second reaction when receiving current at a second potential from the photovoltaic device.

11. The device of claim 10, wherein the first reaction is the reduction of carbon dioxide to carbon monoxide or a first hydrocarbon and the second reaction is the reduction of carbon monoxide to a second hydrocarbon.

12. The device of claim 11, wherein the first hydrocarbon or the second hydrocarbon comprises ethylene.

13. The device of claim 1 further comprising a plurality of additional catalysts, wherein the photovoltaic device is capable of generating a current at a potential for each catalyst within the device.

14. A device comprising:
    a three-terminal tandem semiconductor photovoltaic device capable of generating current at a first potential and a second potential;
    a Ag or Au electrocatalyst in electronic communication with the photovoltaic device configured to catalyze a first reaction upon receiving current at the first potential; and
    a Cu electrocatalyst in electronic communication with the photovoltaic device configured to catalyze a second reaction upon receiving current at a second potential;
    wherein the photovoltaic device comprises a photoelectrode and a transparent conductive encapsulant (TCE) layer which further comprises a polymer, a plurality of microspheres of the Ag or Au electrocatalyst and a plurality of microspheres of the Cu electrocatalyst.

\* \* \* \* \*